US009941111B2

(12) United States Patent
Schmidt et al.

(10) Patent No.: US 9,941,111 B2
(45) Date of Patent: Apr. 10, 2018

(54) METHOD FOR PROCESSING A SEMICONDUCTOR LAYER, METHOD FOR PROCESSING A SILICON SUBSTRATE, AND METHOD FOR PROCESSING A SILICON LAYER

(71) Applicant: Infineon Technologies AG, Neubiberg (DE)

(72) Inventors: Gerhard Schmidt, Wernberg (AT); Markus Kahn, Rangersdorf (AT); Christian Maier, Egg am See (AT); Philipp Koch, Villach (AT); Juergen Steinbrenner, Noetsch (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 14/724,947

(22) Filed: May 29, 2015

(65) Prior Publication Data
US 2016/0351413 A1 Dec. 1, 2016

(51) Int. Cl.
*H01L 21/02* (2006.01)
*H01L 21/28* (2006.01)
(Continued)

(52) U.S. Cl.
CPC .. *H01L 21/02115* (2013.01); *H01L 21/02164* (2013.01); *H01L 21/02301* (2013.01);
(Continued)

(58) Field of Classification Search
CPC ......... H01L 21/31116; H01L 21/02266; H01L 21/3065; H01L 21/02115; H01L 29/51;
(Continued)

(56) References Cited

U.S. PATENT DOCUMENTS 5,397,428 A * 3/1995 Stoner .................... C23C 16/02
117/103
5,462,898 A * 10/1995 Chen ............... H01L 21/02164
257/E21.241
(Continued)

FOREIGN PATENT DOCUMENTS

WO WO 2014/008696 * 1/2014 ........... H01L 21/336

OTHER PUBLICATIONS

S. Wolf and R.N. Tauber, (Silicon Processing for the VLSI Era, vol. 1—Process Technology, Lattice Press, 1986)(pp. 546-547).*
(Continued)

*Primary Examiner* — Duy Deo
*Assistant Examiner* — Mahmoud Dahimene
(74) *Attorney, Agent, or Firm* — Viering, Jentshura & Partner mbB

(57) ABSTRACT

According to various embodiments, a method for processing a semiconductor layer may include: generating an etch plasma in a plasma chamber of a remote plasma source, wherein the plasma chamber of the remote plasma source is coupled to a processing chamber for processing the semiconductor layer; introducing the etch plasma into the processing chamber to remove a native oxide layer from a surface of the semiconductor layer and at most a negligible amount of semiconductor material of the semiconductor layer; and, subsequently, depositing a dielectric layer directly on the surface of the semiconductor layer.

12 Claims, 14 Drawing Sheets

(51) Int. Cl.
*H01L 29/51* (2006.01)
*H01L 29/06* (2006.01)
*H01L 29/16* (2006.01)
*H01L 21/3065* (2006.01)
*H01L 29/66* (2006.01)

(52) U.S. Cl.
CPC .. *H01L 21/02315* (2013.01); *H01L 21/28194* (2013.01); *H01L 29/0615* (2013.01); *H01L 29/0619* (2013.01); *H01L 29/1602* (2013.01); *H01L 29/1604* (2013.01); *H01L 29/51* (2013.01); *H01L 21/02046* (2013.01); *H01L 21/3065* (2013.01); *H01L 29/66181* (2013.01)

(58) Field of Classification Search
CPC ............. H01L 29/1602; H01L 29/0619; H01L 29/0615; H01L 21/28194; H01L 29/1604; H01L 21/02315; H01L 21/02301; H01L 21/02164; H01L 29/66181; H01L 21/02046
See application file for complete search history.

(56) References Cited

U.S. PATENT DOCUMENTS

| | | | | |
|---|---|---|---|---|
| 6,114,216 A | * | 9/2000 | Yieh | C23C 16/0245 257/E21.149 |
| 6,946,368 B1 | * | 9/2005 | Vandroux | H01L 21/3003 257/E21.212 |
| 9,373,517 B2 | * | 6/2016 | Yang | H01L 21/3065 |
| 9,378,978 B2 | * | 6/2016 | Purayath | H01L 21/32137 |
| 2002/0073922 A1 | * | 6/2002 | Frankel | C23C 16/401 118/715 |
| 2006/0154494 A1 | * | 7/2006 | Qi | C23C 16/045 438/787 |
| 2015/0194501 A1 | * | 7/2015 | Yin | H01L 29/66545 438/300 |

OTHER PUBLICATIONS

Harrel et al.: "Observation of Poole-Frenkel effect saturation in SiO2 and other insulating films", Thin Solid Films 352, 1999, pp. 195-204.
Allon-Alaluf et al.: "Metal contacts and electrical processes in amorphous diamond-like carbon films", Diamond and Related Materials 5, 1996, pp. 1275-1281.
SZE: "Physics of Semicondutor Devices", 1981, pp. 255-258 and pp. 362-379, John Wiley & Sons, Inc.
Nicollian et al: "The Si-SiO2 Interface—Electrical Properties as Determined by the Metal-Insulator-Silicon Conductance Technique", Bell System Technical Journal vol. 46, No. 6, 1967, pp. 1055-1133.
Fitzgerald et al.: "Surface Recombination in Semiconductors", Surface Science 9, 1968, pp. 347-369.
Lau: "Infrared Characterization for Microelectronics", 1999, pp. 63-65, World Scientific Publishing Co. Pte. Ltd.

* cited by examiner

```
Exposing at least one surface of the silicon layer to an etch plasma that is provided
by a remote plasma source, wherein the etch plasma is generated in the remote
plasma source from a fluorine containing gas                                          — 410

↓

Depositing a dielectric layer directly on the at least one surface of the silicon layer — 420
```

400

500

METHOD FOR PROCESSING A SEMICONDUCTOR LAYER, METHOD FOR PROCESSING A SILICON SUBSTRATE, AND METHOD FOR PROCESSING A SILICON LAYER

TECHNICAL FIELD

Various embodiments relate generally to a method for processing a semiconductor layer, a method for processing a silicon substrate, and a method for processing a silicon layer.

BACKGROUND

In general, high quality dielectric layers may be used in a semiconductor device, e.g. to control the field effect in a metal oxide semiconductor (MOS) channel. Further, high quality dielectric layers may be used in power semiconductor devices, e.g., for the control of high field strengths in a high-voltage edge termination. A silicon oxide layer may be grown on a silicon layer or on a silicon substrate by thermal oxidation, therefore, a high quality silicon oxide dielectric layer can be formed over a silicon layer or over a silicon wafer. Thermal oxidation processes may include, for example, furnace-growth or rapid thermal oxidation (RTO). However, thermal oxidation can only be used in the earliest stages of integrated circuit manufacturing. In general, various methods can be used to form a dielectric layer over a wafer or over another layer, wherein the chemical and physical properties, e.g. microstructure, chemical composition, homogeneity, surface roughness, electronic properties, band structure, electronic density of states (DOS), interface traps and fixed charges, etc., of the dielectric layer may reflect the manufacturing process. Further, also the physical properties of an integrated circuit, e.g. blocking voltage, operating voltage, leakage current, dielectric breakdown, current-voltage characteristics (so called I-V-curves), etc., may reflect the manufacturing process that was used for forming the respective structure elements of the integrated circuit.

SUMMARY

According to various embodiments, a method for processing a semiconductor layer may include: generating an etch plasma in a plasma chamber of a remote plasma source, wherein the plasma chamber of the remote plasma source is coupled to a processing chamber for processing the semiconductor layer; introducing the etch plasma into the processing chamber to remove a native oxide layer from a surface of the semiconductor layer and at most a negligible amount of semiconductor material of the semiconductor layer; and, subsequently, depositing a dielectric layer directly on the surface of the semiconductor layer.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

Figure 1:
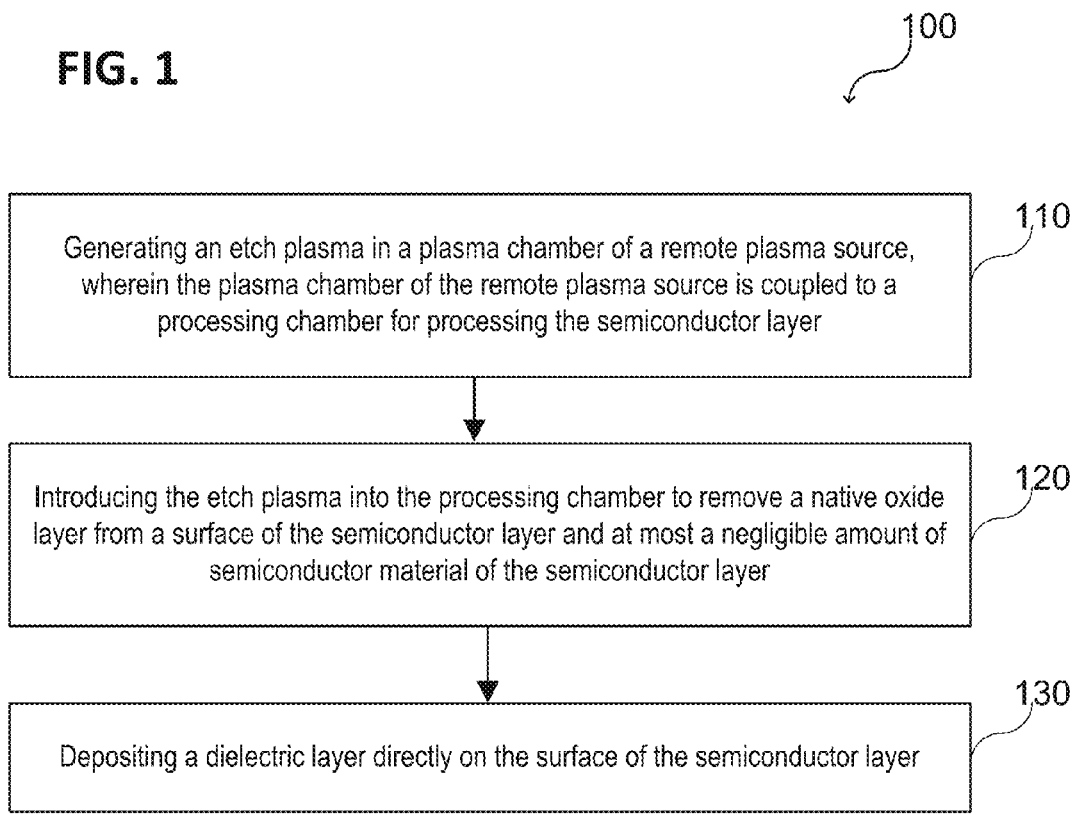
FIG. 1 shows a method for processing a semiconductor layer in a schematic flow diagram, according to various embodiments.

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

The term "layer" used with regards to a silicon layer or a semiconductor layer may be used herein to mean at least one of a wafer or a part of a wafer, a substrate or a part of a substrate, a work piece or a part of a work piece. Further, the term "layer" used with regards to a silicon layer or a semiconductor layer may be used herein to mean an exposed surface layer or surface region of any type of carrier or work piece. Further, the term "layer" used with regards to a silicon layer or a semiconductor layer may be used herein to mean a layer disposed over (e.g. directly on) any type of carrier or work piece.

The term "lateral" used with regards to the "lateral" extension of a structure (or of a structure element) provided at least one of on or in a carrier (e.g. a substrate, a wafer, or a semiconductor work piece) or "laterally" next to, may be used herein to mean an extension or a positional relationship along a surface of the carrier. That means that a surface of a carrier (e.g. a surface of a substrate, a surface of a wafer, or a surface of a work piece) may serve as reference, commonly referred to as the main processing surface. Further, the term "width" used with regards to a "width" of a structure (or of a structure element) may be used herein to mean the lateral extension of a structure. Further, the term "height" used with regards to a height of a structure (or of a structure element), may be used herein to mean an extension of a structure along a direction perpendicular to the surface of a carrier (e.g. perpendicular to the main processing surface of a carrier). The term "thickness" used with regards to a "thickness" of a layer may be used herein to mean the spatial extension of the layer perpendicular to the surface of the support (the material or material structure) on which the layer is deposited. If a surface of the support is parallel to the surface of the carrier (e.g. parallel to the main processing surface) the "thickness" of the layer deposited on the surface of the support may be the same as the height of the layer. Further, a "vertical" structure may be referred to as a structure extending in a direction perpendicular to the lateral direction (e.g. perpendicular to the main processing surface of a carrier) and a "vertical" extension may be referred to as an extension along a direction perpendicular to the lateral direction (e.g. an extension perpendicular to the main processing surface of a carrier).

Various commonly used plasma processes in semiconductor processing may include a so called in-situ plasma that is generated in a processing region in the surrounding of a wafer or any other carrier to be processed. This in-situ plasma contains a large number of electrically charged ions. The wafer that may be subjected to an in-situ plasma, even if set electrically floating, may develop a substantial bias in the presence of the in-situ plasma so that the charged ions may be accelerated towards the wafer and impact into the wafer. Theses accelerated ions (having for example high kinetic energy) may cause an ion damage by momentum transfer in the crystal structure of the wafer (e.g. of a surface region of a silicon wafer or silicon layer) that may prevent growing a high-quality dielectric layer over the wafer. Various embodiments may be related to the finding that using an in-situ plasma for etching a surface of a wafer or layer may not allow to form a dielectric layer directly on the etched wafer or layer with a high-quality interface, e.g. due to the ion bombardment during the in-situ plasma etching.

High-quality dielectrics may play a crucial role in modern power semiconductor devices. They may be used, e.g. as thin gate dielectric layer, to control the field effect in the MOS channel and as dielectric layer for edge termination. For this purpose, silicon based or carbon based materials may be used. These include, for example, silicon oxide ($SiO_2$), silicon nitride ($Si_3N_4$), or hybrids like silicon oxynitride ($SiO_xN_y$), which are commonly grown by thermal oxidation or via a low pressures chemical vapor deposition (LPCVD) furnace process. Therefore, conventionally used processes for forming high-quality dielectrics may need high temperatures, e.g. greater than about 1000° C.

Carbon based dielectric materials, as for example diamond-like carbon (DLC), may be deposited preferentially by a physical vapor deposition (PVD) process or by a plasma enhanced chemical vapor deposition (PECVD) process. Usually, gaseous precursor, as for example $CH_4$, $SiH_4$, or other hydrogen containing chemical compounds, may be used for growing dielectric layers by a PECVD process. Therefore, a hydrogen containing amorphous layer may be formed as dielectric layer, including for example amorphous hydrogenated carbon (a-C:H) or silicon containing amorphous hydrogenated carbon (a-Si,C:H). Further, a silicon based PECVD layer may be used as dielectric layer, including or consisting of, for example, hydrogen containing amorphous silicon (a-Si:H) or hydrogen and nitrogen containing amorphous silicon (a-Si:N:H). Further, a dielectric layer may be used including hydrogen and oxygen containing amorphous silicon (a-Si—O:H), wherein, for example, $SiH_4$ in combination with $NH_3$ and/or $O_2$ may be used as precursor gases for deposition, or wherein oxygen, carbon and/or silicon containing chemical compounds, as for example hexamethyldisiloxane (HMDSO), may be used as precursor for deposition.

A physical vapor deposition process for depositing a dielectric layer may include magnetron sputtering, e.g. reactive magnetron sputtering with directed current (DC), pulsed DC and RF (radio frequency) plasma excitation, wherein less or even no hydrogen may be incorporated into the deposited layers. Further, highly ionized sputtering (HIS) may be used for depositing a dielectric layer.

Alternatively, a carbonitride (e.g. a-Si,C,N:H) may be deposited by reactive magnetron sputtering or PECVD. In this case, hydrogen may be incorporated into the deposited dielectric layers depending on the chemistry of the precursors that are used.

It was found, that hydrogen may have a substantial influence regarding the layer structure and the charge states in the dielectric material. In general, hydrogen may lead to a significant saturation of free valences in the amorphous layer structure. In the development of new concepts for electronic components, a dielectric layer may be provided preferably highly resistive, poor of charges, and robust with respect to high electrical field strengths.

Another aspect may be the formation of a preferably defect-free interface between a dielectric material layer and a semiconductor substrate or a semiconductor layer. A thermally grown oxide may be conventionally a key component in semiconductor devices based on silicon. A defect containing surface zone of a silicon wafer or silicon layer may converted into silicon oxide during thermal growth and, at the same time, a sufficient saturation of free silicon valences can be achieved during thermal growth of silicon oxide from the silicon wafer or silicon layer, such that surface states (so called "Tamm" states) are neutralized to a great extent caused by the breaking of translational symmetry.

According to various embodiments, a high-quality dielectric layer with a high-quality interface to a semiconductor material may be provided, wherein the dielectric layer may be formed by a deposition process. In other words, the dielectric layer may be formed directly on a surface of a semiconductor wafer or on a surface semiconductor layer in contrast to a thermal growth process, wherein semiconductor material of the wafer or layer is transformed into the respective oxide.

According to various embodiments, a careful adjustment has to be made to ensure a sufficiently low interface state density (in the literature, the interface state density, also referred to as surface state density or density of states at the interface/surface, may be abbreviated with the term $D_{st}$, wherein the term DOS may be used regarding the bulk density of states) including a suitable pre-conditioning of a semiconductor wafer or semiconductor layer and an in-situ deposition of a dielectric layer on the semiconductor wafer or semiconductor layer, e.g. in case that a semiconductor material is used, e.g. a wide bandgap material like silicon carbide (SiC) or gallium arsenide (GaN), wherein a thermal oxidation cannot be carried out or only in a limited way, or in the case, wherein the required high temperature process for the thermal oxidation cannot be carried out due to other reasons in the process sequence.

If silicon may be used as semiconductor material, or in other words, if a surface of a silicon wafer (or in analogy of a silicon layer) shall be covered with a high-quality dielectric layer, a pre-conditioning may be used to remove native oxide from the silicon wafer and to remove defects in the silicon single crystal or in the single crystalline silicon, according to various embodiments. The pre-conditioning may be carried out by using a reactive fluorine plasma with a preferably low ion energy. If the plasma power may be selected to high, the silicon crystal may be damaged in form of lattice damages caused by the oxide/silicon etch process. According to various embodiments, a low oxide/silicon etch rate may be set to keep the processing time in technically accessible limits. According to various embodiments, an etch rate during a pre-conditioning of a semiconductor surface region using a halogen containing etch plasma (e.g. a remote etch plasma) may be in the range from about 0.05 nm/s to about 5.0 nm/s, e.g. in the range from about 0.2 nm/s to about 0.6 nm/s. According to various embodiments, an etch rate during a pre-conditioning of a silicon surface region using a fluorine containing etch plasma (e.g. a remote etch plasma) may be in the range from about 0.05 nm/s to about 5.0 nm/s, e.g. in the range from about 0.2 nm/s to about 0.6 nm/s.

According to various embodiments, a remote plasma source (RPS) may be utilized to generate a plasma of a processing gas (e.g. a halogen containing processing gas, e.g. a fluorine containing processing gas) at a location remote from the substrate (e.g. the wafer) to be etched. The remote plasma may be for example generated outside a processing chamber, e.g. outside a processing chamber for in-situ depositing a dielectric material over the substrate (e.g. the wafer).

According to various embodiments, a method for processing a silicon substrate may include pretreating at least one surface of a silicon substrate or of a silicon layer using an etch plasma that is provided in a processing region of a processing chamber by a remote plasma source coupled to the processing chamber, wherein the etch plasma is generated from a halogen (e.g. fluorine) containing gas.

According to various embodiments, a sputter/etch platform may be utilized for processing the wafer, substrate or layer, as described herein. As an example, an Applied Materials sputter/etch platform in a so-called MK-II chamber could be utilized.

According to various embodiments, the plasma power of the remote plasma source may be adapted to provide a suitable pre-conditioning (also referred to as pretreating) of the surface of the semiconductor layer (e.g. of a silicon wafer). According to various embodiments, the remote plasma power may be provided in the range from about 10 W to about 10000 W, e.g. in the range from about 100 W to about 2000 W, e.g. about 1000 W. According to various embodiments, the used plasma power may be only a small percentage of the maximum generator power of the used remote plasma source. Further, the gas flow of the halogen containing gas into the remote plasma source may be adapted to provide a suitable pre-conditioning of the surface of the semiconductor layer. According to various embodiments, the gas flow of the halogen containing gas (e.g. $NF_3$) may be less than about 100 sccm or less than about 50 sccm, e.g. in the range from about 1 sccm to about 100 sccm, e.g. in the range from about 1 sccm to about 50 sccm, e.g. in the range from about 1 sccm to about 10 sccm. Further, the gas pressure in the processing chamber may be adapted to provide a suitable pre-conditioning of the surface of the semiconductor layer. According to various embodiments, during pre-conditioning (or in other words during the RPS process, as described herein) the gas pressure in the processing chamber may be less than about 200 Torr, e.g. in the range from about 1 mTorr to about 200 Torr. Further, according to various embodiments, the halogen containing gas may be diluted by using a noble gas, e.g. helium or argon. The gas flow rate of the noble gas may be larger than the gas flow rate of the halogen containing gas. The gas flow rate of the noble gas may be in the range from about 5 sccm to about 3000 sccm, e.g. in the range from about 1000 sccm to about 3000 sccm. However, the RPS process may also be carried out without using noble gas. Further, according to various embodiments, the etching time for which the surface of the semiconductor layer or semiconductor substrate may be exposed to the remote plasma may be in the range from about 1 s to about 300 s, e.g. in the range from about 10 s to about 100 s.

According to various embodiments, if the substrate is a silicon substrate or if the layer is a silicon layer, less than 10 nm silicon oxide may be removed during pre-conditioning, e.g. less than 7 nm, e.g. 6 nm. According to various embodiments, if the silicon at the surface of the silicon substrate or if the surface of the silicon layer is damaged, the damaged silicon may be removed, e.g. up to 100 nm silicon may be removed.

According to various embodiments, a method for processing a silicon substrate may include depositing a dielectric layer directly on at least one surface of a pre-conditioned substrate or layer, as described herein. According to various embodiments, the processing chamber may be completely anodized so that a contamination of the pre-conditioned substrate by elements like aluminum and/or magnesium (e.g. removed from the chamber walls) is kept low. Alternatively, if the chamber walls of the processing chamber are not anodized, they may be covered by thick ceramic rings etc., so that the plasma may not attack the chamber walls.

In commonly applied plasma etch processes, an in-situ plasma may be provided between the substrate and the chamber walls of a processing chamber, wherein the etch process may be configured as hard etch (including for example ion bombardment of the substrate during etch), wherein the substrate is a so called hot electrode.

If a processing chamber for in-situ plasma processing would not include a protection layer, the chamber walls including, for example, aluminum and the showerhead would be attacked by the in-situ plasma and the processed substrate (e.g. wafer) would be contaminated by the aluminum (or another metal) removed from the chamber walls.

According to various embodiments, the deposition of the dielectric material (e.g. a-Si,C:H) may be carried out in the very same processing chamber as the pre-conditioning of the substrate or layer, since an interruption of the high vacuum would lead to an immediate growth of a native oxide layer on the substrate or layer. A break of the vacuum during processing (or in other words an exposure of the pre-conditioned substrate or layer to air, or more specifically to oxygen) would lead to fluctuations in the electrical parameters of the processed semiconductor (power) device.

For this reasons, the deposition of the adapted dielectric material after pre-conditioning may be carried out the very same processing chamber (in-situ), wherein the pre-conditioned substrate or layer is not subjected to air after the pre-conditioning (without interruption of the high vacuum in the chamber).

The geometry of an etch-chamber that is offered commercially may not be designed for a deposition process, therefore, compromises in the control of the deposition process have to be accepted or, alternatively, the etch-chamber has to be adapted.

Using an in-situ plasma may not allow an optimal pre-conditioning, since an in-situ plasma causes an ion bombardment of the substrate or layer. The ion bombardment, even under optimized conditions with a low ion energy, may damage the semiconductor crystal. This results in a higher interface state density after deposition of the dielectric layer on the semiconductor crystal compared to a thermal oxidation process.

Therefore, an indirect pre-conditioning of the semiconductor substrate may be provided that does not damage the semiconductor substrate, in combination with an in-situ deposition of a layer over the semiconductor substrate.

Further, there are additional requirements for a technically proper deposition of the dielectric layer, as for example the deposition temperature of about 400° C. and a processing chamber that is optimized for deposition with a long running time, that provides a sufficient throughput, and that can be integrated in the established equipment.

According to various embodiments, for depositing dielectric materials from the systems Si—O, Si—N, Si—O—N, Si—C, etc. a processing chamber may be used including parallel capacitor plates of the same size for a so called soft process. During a soft deposition the substrate (e.g. the wafer) may be on the cold electrode to prevent ion damages. In this type of processing chamber, the precursor chemistry and the adjustable spacing of the capacitor plates may be the processes parameters to be controlled. Therefore, this type of processing chamber may be ideal with respect to the quality of the deposited dielectric layer and the minimum possible damaging of the substrate (e.g. wafer).

However, to facilitate a suitable interface cleaning of the semiconductor material with a minimal density of states, new process technology paths must be taken in conventionally used chamber types.

An in-situ $NF_3$/He plasma process in a typical deposition chamber can lead to a very high Al and Mg concentration on the wafers treated in this way. As already described, this may result from an etching attack of the one or more showerheads disposed in the processing chamber that conventionally consist of an aluminum alloy. The other parts of such a processing chamber may be made of ceramic materials and may be therefore inert regarding an $NF_3$/He plasma discharge. For process-related reasons, the showerhead may be protected by a thin anodization including $Al_2O_3$; however, the running time of an anodized showerhead may be limited to a few hundred hours. The renovations related to the limited lifetime of a showerhead during volume operation conflict with a long running time of several ten thousand hours of the deposition chamber otherwise. Therefore, an in-situ plasma process for removing, for example, native oxide and damaged semiconductor material from a substrate (e.g. wafer) may be impractical for such a type of deposition chamber.

According to various embodiments, a deposition chamber may be utilized that is coupled to a remote plasma source (RPS). The remote plasma source may be, for example, an upgrade kit for the respective processing chamber. Conventionally, a remote plasma source may only be used for cleaning the processing chamber after the actual deposition step, e.g. to remove an undesired deposition of dielectric material from the walls of the processing chamber.

According to various embodiments, the remote plasma source may be used for pre-conditioning a semiconductor substrate (e.g. a semiconductor wafer), as described herein. This type of ion source allows a pre-conditioning without a substantial momentum transfer of the radicals to the substrate, since the radicals may reach the substrate only by diffusion without the otherwise usual acceleration due to a self-adjusting DC-Bias in the plasma.

However, a modification in the process procedure is needed for the beneficial use of the remote plasma source for pre-conditioning, as described herein.

The process procedure used for a chamber clean process may include an initial phase, wherein a pure argon plasma is used, followed by a cleaning phase, wherein additionally a large quantity of $NF_3$ is added in the range of about 1000 sccm. During a shutdown phase the $NF_3$-portion is removed again. The intention is that in the actual chamber cleaning step a large quantity of fluorine radicals is introduced into the processing chamber and guided over the showerhead, wherein only undesired dielectric material is removed by the etchant.

Various embodiments relate on the finding, that a remote plasma source can be utilized for in-situ pre-conditioning of a semiconductor substrate, wherein an adapted process procedure is used based on the hardware including a remote plasma source coupled to a deposition chamber.

An objective may be to use the RPS-process with the absent ion damage to assure a suitable interface, as described before, as an advantage for interface-optimization before depositing the dielectric material.

Without a modification of the conventionally used RPS chamber clean process, the semiconductor substrate would be destroyed during processing. A conventionally used RPS process would result in uncontrolled high etch rates at a pure silicon surface so that after such a process the processing chamber would be contaminated and a new built up would be necessary. A direct wafer processing using a conventionally established RPS chamber clean process is therefore not effective or even impossible.

According to various embodiments, compared to an RPS chamber clean process, the gas flow rate of the halogen containing gas (e.g. $NF_3$) may be reduced by at least one order of magnitude, e.g. to a gas flow rate in the range from about 1 sccm to about 100 sccm. As already described, additional process parameters, as for example, pressure, dilution, and processing time may be adapted to assure absence of defects at a surface (or surface region) of a (e.g. silicon) wafer. In addition to the absence of defects the quality of the interface may be optimized by adapting the process parameters. It is demonstrated that a leakage current of a high voltage component with a VLD-DLC edge termination can be reduced by at least a factor of two compared to conventionally used processes.

According to various embodiments, a remote plasma source (RPS), also referred to as remote ion source, may be utilized for an in-situ pre-conditioning of a semiconductor surface in combination with a PVD or CVD process for depositing a dielectric material (e.g. in form of a layer or thin film) directly on the pre-conditioned semiconductor surface, wherein the dielectric material may be silicon based or carbon based or may include other electrically insulating or semi-insulating materials. Further, a parameter space for the RPS pre-conditioning may be provided that include a great dilution of the flour radicals, wherein the dilution may be carried out by using a noble gas, e.g. Ar, He, Ne, and the like. The crystal damage of the pre-conditioned semiconductor crystal may be reduced to a minimum, since the etch rate is reduced and the ion bombardment of the substrate with high energy ions could be avoided due to providing the plasma remote from the substrate (in contrast to reactive ion etching with a DC-Bias on the substrate). Therefore, the interface state density may be reduced, which has a positive effect on the leakage current and the field-effect behavior of the electronic component or the electronic device.

The use of one or more hydrogen containing precursor gases in a PECVD process may be beneficial for the deposition of the dielectric material, since the hydrogen supports the saturation of free valences and therefore the reduction of the density of states both in the bulk material and at the interface. Hence, the interface state density may be reduced to values of less than about $2 \cdot 10^{13}$ $cm^{-2}$ $eV^{-1}$ with a corresponding surface recombination speed, so, of less than about 4000 cm/s.

According to various embodiments, the RPS may be combined with a so called MKII processing tool from AMAT (APPLIED MATERIALS INC.), a so called CxZ processing tool from Centura and Producer, or else from other tool suppliers. In addition, the RPS can in principle be combined with a PVD processing tool as well, preferentially for dielectric deposition. Further, the RPS pre-conditioning, as described herein, may be combined with sub-atmospheric chemical vapor deposition (SA-CVD) using for example tetraethyl-orthosilicate (TEOS) and ozone.

According to various embodiments, the pressure in the processing chamber during a deposition process may be adapted, for example, to the utilized processing tool, type of deposition process, and/or material to be deposited. According to various embodiments, a pressure in the range from about 1 mTorr to about 100 mTorr may be used for high density plasma (HDP) deposition. According to various embodiments, a pressure in the range from about 1 Torr to about 30 Torr may be used in combination with a typical capacitive coupled deposition chamber. Further, a pressure in the range from about 1 Torr to about 200 Torr may be used in combination with a SA-CVD process. The conditions (e.g. the pressure) used for the RPS pre-conditioning, as described herein, may be selected independently from the deposition conditions for deposition the dielectric material after the RPS pre-conditioning.

FIG. 1 illustrates a method 100 for processing a semiconductor layer in a schematic flow diagram, according to various embodiments. The semiconductor layer may be, for example, an epitaxially grown and/or single crystalline semiconductor layer disposed on any suitable carrier (e.g. on a wafer, etc.) or the semiconductor layer may be part of a single crystalline semiconductor carrier (e.g. wafer, etc.).

According to various embodiments, the method 100 may include: in 110, generating an etch plasma in a plasma chamber of a remote plasma source, wherein the plasma chamber of the remote plasma source is coupled to a processing chamber for processing the semiconductor layer; in 120, introducing the etch plasma into the processing chamber to remove a native oxide layer from a surface of the semiconductor layer and at most a negligible amount of semiconductor material of the semiconductor layer; and, subsequently, in 130, depositing a dielectric layer directly on the surface of the semiconductor layer.

According to various embodiments, the native oxide layer may be formed prior to step 110 of method 100 to protect the surface of the semiconductor layer or the native oxide layer may grow on the semiconductor layer due to exposing the semiconductor layer to air, or more specifically to oxygen. According to various embodiments, the native oxide layer may be utilized to remove small damages from the surface of the semiconductor layer by chemically convert a surface region of the semiconductor layer into a native oxide layer.

According to various embodiments, removing at most a negligible amount of semiconductor material may include the case where no semiconductor material of the semiconductor layer is removed. According to various embodiments, removing at most a negligible amount of semiconductor material of the semiconductor layer may include removing at most a few atomic layers of the single crystalline semiconductor layer, e.g. up to about 100 atomic layers (e.g. 1 to 100 atomic layers), e.g. up to about 50 atomic layers (e.g. 1 to 50 atomic layers), e.g. up to about 10 atomic layers (e.g. 1 to 10 atomic layers), e.g. up to 5 atomic layers (e.g. 1 to 5 atomic layers). Further, removing at most a negligible amount of semiconductor material of the semiconductor layer may include removing up to about 30 nm, e.g. about 1 nm to about 30 nm, of the semiconductor material of the semiconductor layer in thickness direction (e.g. a direction perpendicular to a main processing surface of a wafer).

Figure 2:
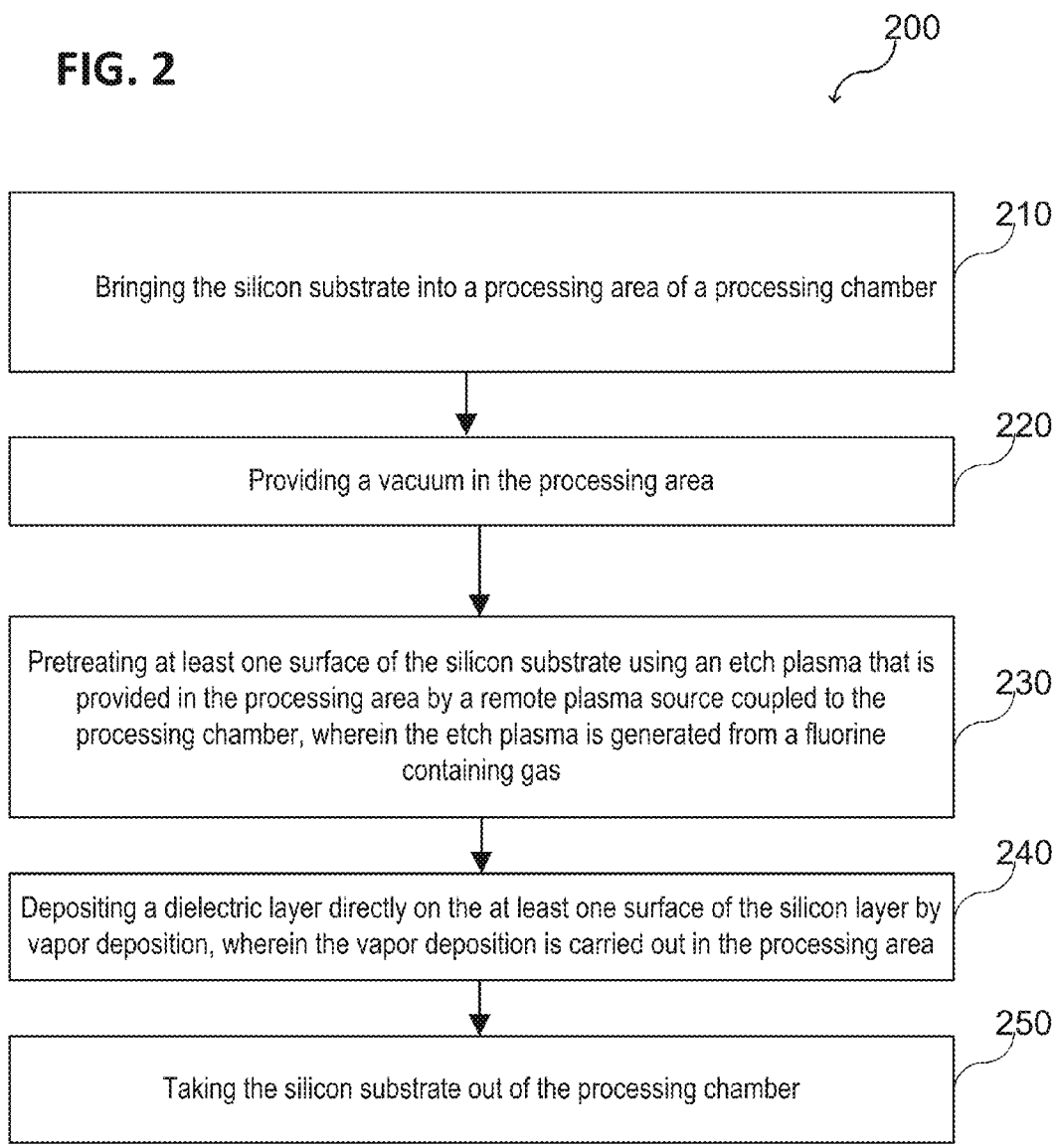
FIG. 2 shows a method for processing a silicon substrate in a schematic flow diagram, according to various embodiments.

FIG. 2 illustrates a method 200 for processing a silicon substrate in a schematic flow diagram, according to various embodiments. The silicon substrate may be, for example, a single crystalline silicon substrate (e.g. wafer, or any other type of single crystalline silicon carrier).

The method 200 may include: in 210, bringing the silicon substrate into a processing region of a processing chamber; in 220, providing a vacuum in the processing region; in 230, pretreating at least one surface of the silicon substrate using an etch plasma that is provided in the processing region by a remote plasma source coupled to the processing chamber, wherein the etch plasma is generated from a fluorine containing gas; and, subsequently, in 240, depositing a dielectric layer directly on the at least one surface of the silicon substrate by vapor deposition, wherein the vapor deposition is carried out in the processing region; and, in 250, taking the silicon substrate out of the processing chamber.

According to various embodiments, method 200 may include an in-situ pretreatment (also referred to as pre-conditioning) and, in the very same processing region, a deposition of a dielectric layer directly on the surface of the pretreated silicon substrate. According to various embodiments, pretreating at least one surface of the silicon substrate may include removing an oxide layer (e.g. a native oxide layer) from the at least one surface of the silicon substrate completely. According to various embodiments, pretreating at least one surface of the silicon substrate may further include removing a surface region (e.g. an about 1 nm to about 30 nm thick surface region) of the silicon substrate.

Figure 3:
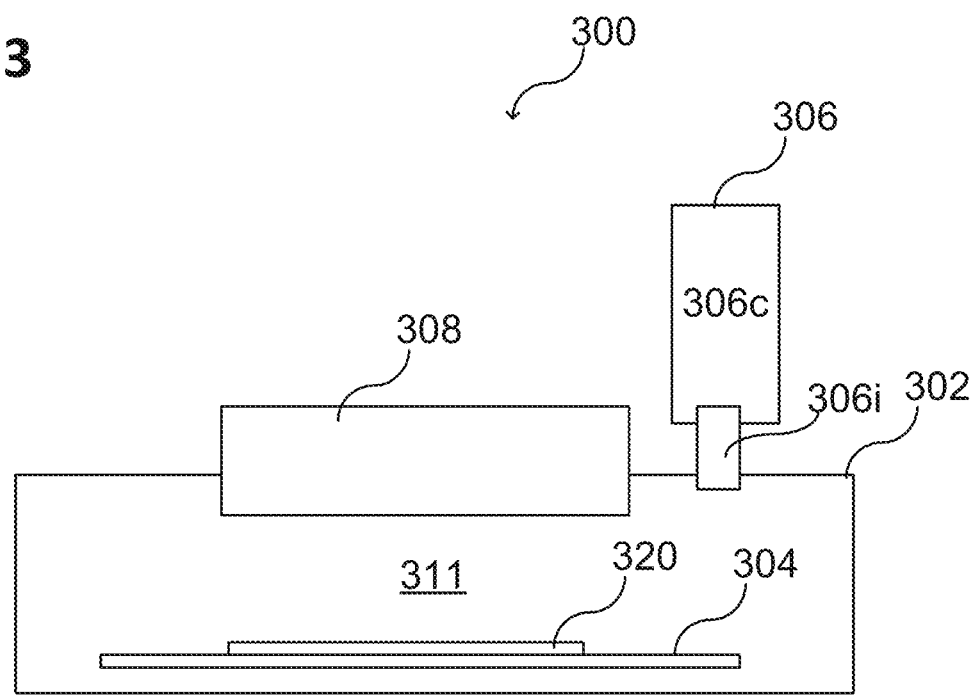
FIG. 3 shows a processing device in a schematic cross sectional view, according to various embodiments.

FIG. 3 shows a processing device 300 in a schematic cross sectional view, according to various embodiments. According to various embodiments, the processing device 300 may be configured that at least one of the method 100 for processing a semiconductor layer, the method 200 for processing a silicon substrate, or a method for processing a silicon layer, as described with reference to FIG. 4, can be carried out.

According to various embodiments, the processing device 300 may include a processing chamber 302. The processing chamber 302 may be a vacuum chamber, e.g. a PVD chamber or CVD chamber (e.g. a PECVD chamber). According to various embodiments, the processing chamber 302 may include a protection layer (e.g. $Al_2O_3$ or any other suitable ceramic) covering the inner walls of the processing chamber 302.

According to various embodiments, the processing device 300 may include a deposition apparatus 308 for depositing a dielectric layer over a substrate 320. The deposition may be carried out in a processing region 311 of the processing chamber 302. According to various embodiments, the processing device 300 may include a plasma generating system (e.g. including two parallel capacitor plates of the same size) for carrying out a PECVD process, or any other plasma assisted deposition process, or in other words, the deposition apparatus 308 of the processing device 300 may be configured to carry out a PECVD process.

According to various embodiments, the processing device 300 may include a substrate holder 304 (e.g. a wafer chuck or any other type of suitable substrate holder) disposed in the processing chamber 302. According to various embodiments, the substrate holder 304 may be electrically coupled to a power generator to apply a DC-Bias or any other type of current or voltage to the substrate 320, e.g. for depositing a dielectric layer.

According to various embodiments, a remote plasma source 306 may be coupled to the processing chamber 302 via an inlet 306i. According to various embodiments, a plasma may be generated in a plasma chamber 306c of the remote plasma source 306. Further, the remote plasma source 306, the inlet 306i, and the processing chamber 302 may be configured so that the plasma generated in the plasma chamber 306c of the remote plasma source 306 can diffuse (or flow) into the processing region 311 inside of the processing chamber 302.

According to various embodiments, the remote plasma source 306 may be configured that substantially only radicals may be introduced into the processing region 311 of the processing chamber 302. In other words, the remote plasma source 306 may include an ion filter or neutralizer.

According to various embodiments, a gas supply (not illustrated) may be coupled to the remote plasma source 306 to introduce a halogen containing gas into the plasma chamber 306c of the remote plasma source 306 that can be exited to plasma. Further, a precursor supply (not illustrated) may be coupled to the processing chamber 302 to introduce, for example, a precursor gas for a PECVD deposition process that may be carried out in the processing region 311 of the processing chamber 302.

According to various embodiments, the etch plasma may be generated in the plasma chamber 306c of the remote plasma source 306 from a halogen containing gas that is provided to the plasma chamber 306c of the remote plasma source 306 with a gas flow rate of less than 100 sccm, e.g. less than 75 sccm, e.g. less than 50 sccm, e.g. less than 45 sccm, e.g. less than 40 sccm, e.g. less than 35 sccm, e.g. less than 30 sccm, e.g. less than 25 sccm, e.g. less than 20 sccm, e.g. less than 15 sccm, e.g. less than 10 sccm, e.g. less than 7 sccm. However, the gas flow rate may be greater than about 0.1 sccm, e.g. greater than about 0.5 sccm, e.g. greater than about 1 sccm, e.g. greater than about 2 sccm, e.g. greater than about 3 sccm.

According to various embodiments, at least one vacuum pump may be coupled to the processing chamber 302 to evacuate the processing chamber 302. In other words, vacuum conditions that allow a PVD or CVD process may be provided in the processing region 311 of the processing chamber 302.

Figures 4, 5:
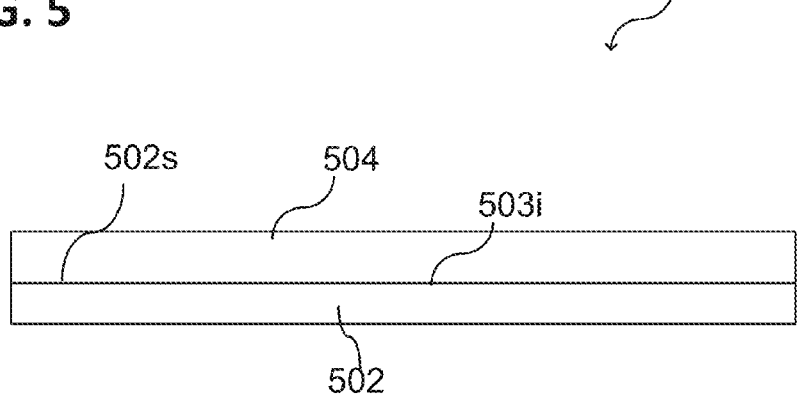
FIG. 4 shows a method for processing a silicon layer in a schematic flow diagram, according to various embodiments.
FIG. 5 shows an electronic device in a schematic cross sectional view, according to various embodiments.

FIG. 4 illustrates a method 400 for processing a silicon layer in a schematic flow diagram, according to various embodiments. The silicon layer may be, for example, a part of a single crystalline silicon substrate (e.g. a part of a single crystalline silicon wafer, or any other type of single crystalline silicon carrier).

According to various embodiments, the method 400 may include: in 410, exposing at least one surface of the silicon layer to an etch plasma that is provided by a remote plasma source, wherein the etch plasma is generated in the remote plasma source from a fluorine containing gas; and, subsequently, in 420, depositing a dielectric layer directly on the at least one surface of the silicon layer.

FIG. 5 illustrates an electronic device 500 in a schematic cross sectional view. The electronic device 500 may include at least a semiconductor substrate 502 or semiconductor layer 502 that is directly covered, e.g. in direct physical contact, with a dielectric layer 504. Is described herein, a high quality interface 503i is provided between the semiconductor material of the semiconductor substrate 502 or semiconductor layer 502 and the dielectric material of the dielectric layer 504.

According to various embodiments, the electronic device 500 may include: a silicon layer 502, wherein at least one surface 502s of the silicon layer is free of native oxide; and a dielectric layer 504 disposed directly one the at least one surface 502s of the silicon layer 502, wherein the dielectric layer 504 includes hydrogen (e.g. since the dielectric layer may be deposited by a respective PVD process or CVD process) and wherein an interface 503i is provided between the silicon layer 502 and the dielectric layer 504 having an interface state density of less than about $2 \cdot 10^{13}$ cm$^{-2}$ eV$^{-1}$. This is equivalent to a surface recombination speed, so, which is less than about 4000 cm/s.

According to various embodiments, the dielectric layer 504 may be deposited by one of chemical vapor deposition (CVD) or physical vapor deposition (PVD).

According to various embodiments, the dielectric layer 504 may be deposited by plasma-enhanced chemical vapor deposition (PECVD). The dielectric layer 504 may be deposited by chemical vapor deposition (e.g. PECVD) using a hydrogen containing precursor, e.g. at least one of methane or silane. Alternatively, the dielectric layer 504 may be deposited by sputter deposition or any other suitable vapor deposition process.

According to various embodiments, the dielectric layer 504 may include at least one of a carbon based dielectric material (e.g. diamond like carbon, amorphous carbon, hydrogenated amorphous carbon, etc.) or a silicon based dielectric material (e.g. amorphous silicon, silicon oxide, silicon nitride, etc.). The dielectric layer 504 may include a carbon/silicon based dielectric material, e.g. a chemical compound described by the formula: $Si_xC_{1-x}$:H or a-$Si_xC_{1-x}$:H, wherein x is a number between 0 and 1, or wherein x is 0 (e.g. for a-C:H) or wherein x is 1 (e.g. for a-Si:H).

According to various embodiments, the semiconductor layer 502 may include silicon. The semiconductor layer 502 may be a silicon wafer or part of a silicon wafer.

According to various embodiments, the dielectric layer 504 may include amorphous carbon, e.g. diamond-like carbon, e.g. hydrogenated amorphous carbon, e.g. silicon doped hydrogenated amorphous carbon. According to various embodiments, the silicon doped hydrogenated amorphous carbon may include 50% to 80% carbon and accordingly 20% to 50% silicon (measured in atomic percent or mole percent).

According to various embodiments, the dielectric layer 504 may include silicon oxide, e.g. hydrogen containing silicon oxide ($SiO_2$:H).

As described herein, admittance spectroscopy may be used for characterizing the electronic density of states ($D_{st}$) at the interface 503i between the semiconductor substrate 502 or semiconductor layer 502 and the dielectric layer 504. In this case, the capacity, C, and the electrical conductance, G, of a metal-insulator-semiconductor capacity (a so called MIS capacity) is measured at least one of voltage-dependent or frequency-dependent. The definition of the complex electrical admittance, Y, reads as follows:

$$Y = G + i\omega C \quad (1);$$

wherein ω (equals 2π·f) is the angular frequency, f is the frequency, and i is the imaginary unit. The measurement can be carried out by superposing a direct current (DC)-bias (in other words a DC-voltage) with an alternating voltage (AC) signal at constant or variable frequency. The interface state density ($D_{st}$) can be determined from the observed resonances. At this, usually an equivalent circuit diagram can be used including several elements (on contrast to a simple parallel connection of a resistor and a capacitor) to describe the physical nature of various influencing factors to the total admittance adequately.

In the following, two typical cases are exemplified in detail. The first case is for a dielectric layer, which has a certain amount of conductance that may be revealed in particular at higher electric field strengths, E. This may be characteristic for amorphous layers that have a conducting mechanism based on field assisted tunneling via deep trap states. The corresponding current density, $j_{PF}$, may satisfy the Poole-Frenkel-Law, in which the specific conductance, σ, increases exponentially with the square root of the electric field strength, E:

$$j_{PF} = \sigma \cdot E \cdot \exp\left(\frac{q \cdot \sqrt{\frac{qE}{\varepsilon\varepsilon_0 \pi}}}{kT}\right); \quad (2)$$

wherein q is the elementary charge, k is the Boltzmann constant, and T is the absolute temperature (in Kelvin). In contrast, the base-conductance, $\sigma_0$, of amorphous layers at low electric field strengths may include a DC-part and an AC-part. The DC-part, $\sigma_{dc}$, may be caused by phonon-assisted tunneling of charge carrier between the trap states near the Fermi level, also referred to as variable range hopping. The AC-part, $\sigma_{ac}$, may be caused by resonant tunneling between pairs of localized states in the mobility gap. The AC-part of the conductance may be described by a power law so that all in all the following holds:

$$\sigma_0 = \sigma_{dc} + \sigma_{ac} = \sigma_{dc} + \text{const} \cdot \omega^s \quad (3);$$

wherein here the value, s, of the exponent for a carbon based dielectric (e.g. DLC) may be about 0.6. The AC-part of the conductance may be dominant over the DC-part from a frequency of about 1 kHz. Such dielectric materials may be also referred to lossy dielectrics, due to dynamic losses caused by the finite resistance.

In a second example, an ideal dielectric material is assumed without an ohmic resistance in the bulk material, as it is the case, for example, for a sufficiently thick gate oxide in a MOS structure.

In both cases, it may be essential to determine the interface density of states ($D_{st}$) from the measured admittance. In conjunction with the capture cross-section of the surface states the interface density of states defines the behavior of the MIS structure or MOS structure regarding the surface generation (in other words the leakage current caused by generation) and the threshold voltage.

Figure 6:
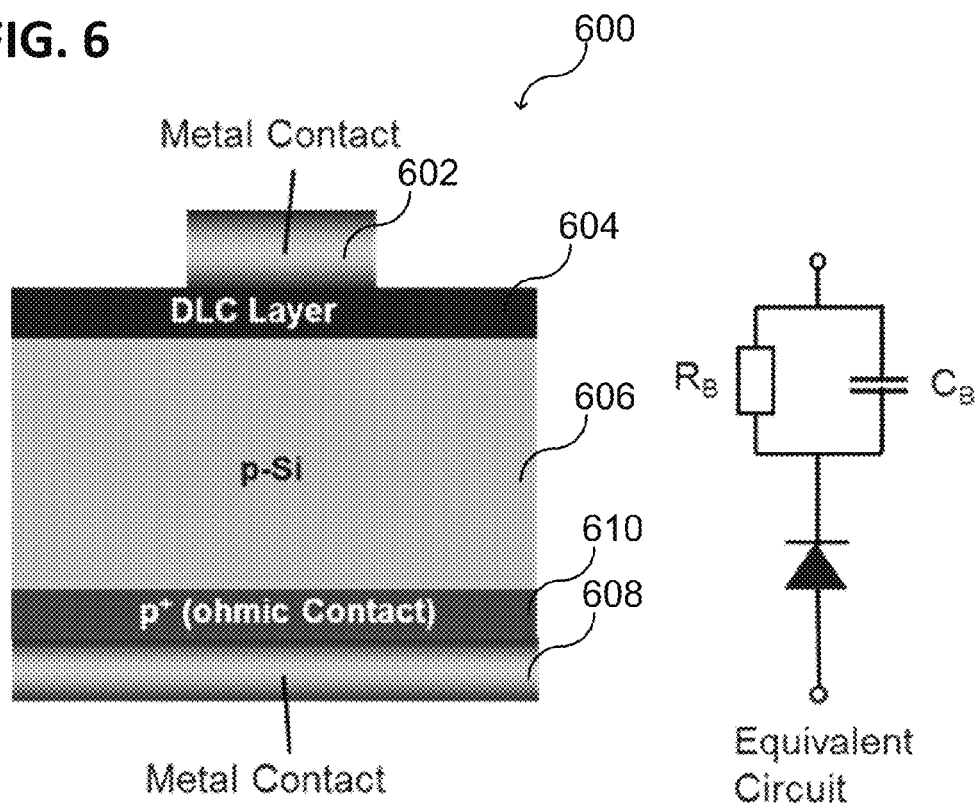
FIG. 6 illustrates a vertical metal insulator semiconductor test structure in a schematic cross sectional view and a corresponding equivalent circuit, according to various embodiments.

FIG. 6 illustrates a metal insulator semiconductor (MIS) test structure 600 in a schematic cross sectional view (left side of FIG. 6) together with a corresponding equivalent circuit (right side of FIG. 6). The MIS test structure 600 may be a MIS capacitor that is formed from a metal layer 602 (also referred to as a first metal contact 602), an electrically insulating layer 604 (e.g. a dielectric layer) and a semiconductor layer 606. A second metal contact 608 may be electrically connected to the semiconductor layer 606, e.g. via an interlayer 610 including highly doped semiconductor material to provide an ohmic contact. According to various embodiments, the dielectric layer 604 may include or may consist of diamond like carbon (DLC). The semiconductor layer 606 may include or may consist of silicon, e.g. p-type doped silicon or n-type doped silicon. According to various embodiments, the interlayer 610 may include or may consist of silicon, e.g. p-type doped silicon or n-type doped silicon, wherein the interlayer 610 may have the same doping type as the semiconductor layer 606 but a higher doping level than the semiconductor layer 606.

According to various embodiments, the vertical MIS test structure 600, as illustrated in FIG. 6, may include a DLC layer and may be used to measure and/or determine the admittance behavior.

In general, the setup illustrated in FIG. 6 may be used to measure and/or determine the interface characteristics of a MIS structure 600, according to various embodiments. In one exemplary embodiment, a 300 nm thick DLC layer 604 may be used that is deposited directly on the semiconductor 606 using various pre-conditionings. In the exemplary embodiment, a p-type doped silicon wafer was used that has a resistivity of about 8 Ωcm. To provide an ohmic contact 608 for the backside metallization a highly p-type doped boundary layer 610 may be provided, e.g. by ion implantation (e.g. boron implantation) and diffusion. The DLC bulk material 604 behaves like an ideal admittance that is characterized by the dielectric capacitance, $C_B$:

$$C_B = \frac{\varepsilon_r \cdot \varepsilon_0}{d}; \qquad (4)$$

and the parallel resistance, $R_B$:

$$R_B = \rho \cdot d \qquad (5).$$

Both physical quantities $C_B$ and $R_B$ are dimensioned per unit area (in other words area-specific) and may be normalized, for example, to a cross section of 1 cm². In equations 4 and 5, $C_B$ is the dielectric capacitance, $\varepsilon_r$ is the relative and $\varepsilon_0$ the absolute permittivity (also referred to as relative and absolute dielectric constant), d is the thickness, $R_B$ the bulk resistance and ρ the resistivity of the DLC layer 604 (or in general of the dielectric layer 604 of the MIS structure). Typical values for $\varepsilon_r$ for a DLC layer 604 may be in the range from about 4 to about 6. This values for $C_B$ and $R_B$ result in the case of accumulation under bias in forward direction (also referred to as forward current). In case of depletion under bias in reverse direction (also referred to as blocking direction) a barrier may be formed in analogy to a Schottky-barrier, which results in an additional contribution for the admittance. This behavior can be described using an equivalent circuit with a serial connection of the bulk admittance 700b with a diode 700s, as illustrated, for example, in FIG. 7. While the diode 700s (apart from the threshold voltage) does not appear in forward direction (accumulation), the diode 700s results in an additional capacitance, $C_S$ (also referred to as depletion layer capacitance), with a parallel resistance, $R_S$ (representing the leakage current over the Schottky-barrier), in reverse direction (depletion).

Figure 7:
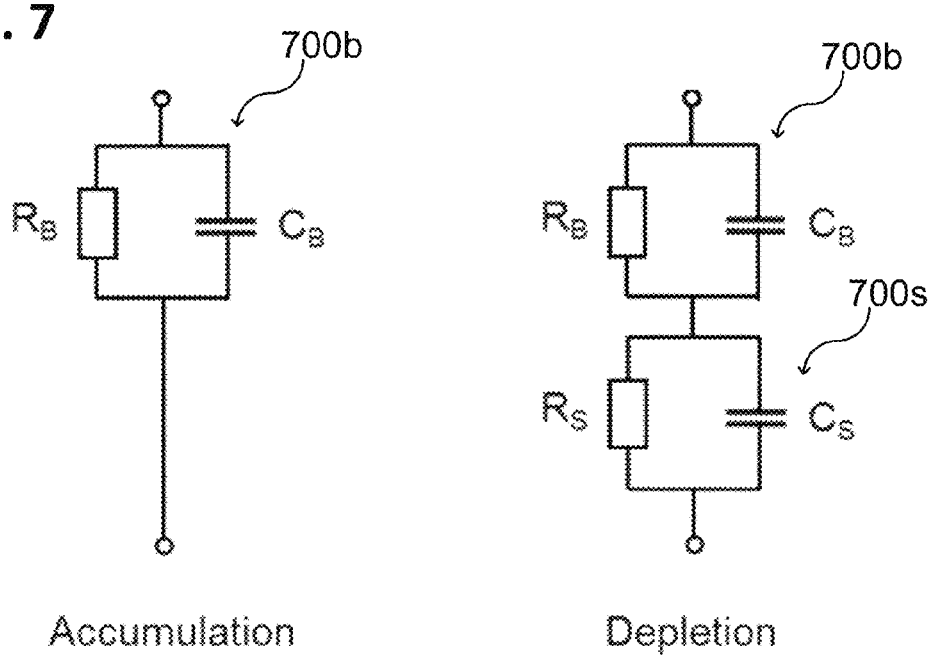
FIG. 7 illustrates corresponding equivalent circuits for a metal insulator semiconductor test structure, according to various embodiments.

As illustrated in FIG. 7 in the equivalent circuits in forward direction (denoted by accumulation on the left side of FIG. 7) and in reverse direction (denoted by depletion on the right side of FIG. 7), both elements, $C_S$ and $R_S$, result in an additional admittance term in series with the DLC-bulk.

Figure 8:
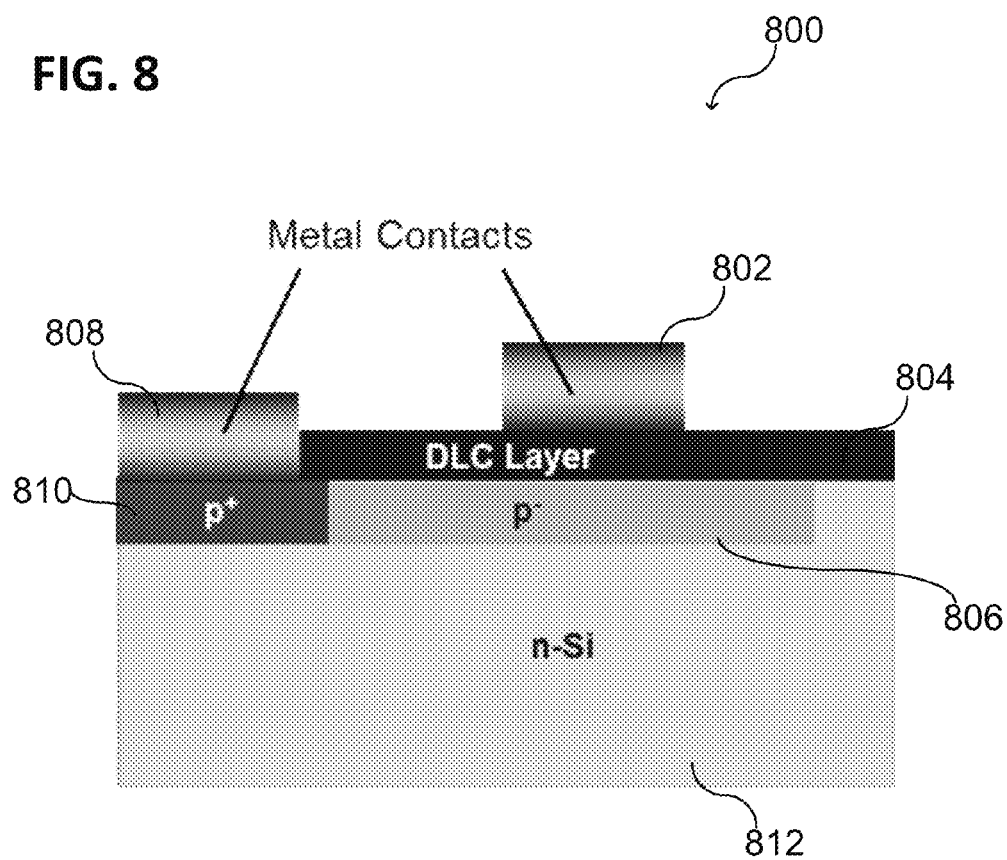
FIG. 8 illustrates a lateral metal insulator semiconductor test structure in a schematic cross sectional view, according to various embodiments.

FIG. 8 illustrates a metal insulator semiconductor (MIS) test structure 800 in a lateral configuration in a schematic cross sectional view (in analogy to the vertical test structure 600, as illustrated in FIG. 6), according to various embodiments.

The lateral MIS test structure 800 may be a MIS capacitor that is formed from a metal layer 802 (also referred to as a first metal contact 802), an electrically insulating layer 804 (e.g. a dielectric layer) and a semiconductor layer 806. A second metal contact 808 may be electrically connected to the semiconductor layer 806, e.g. via an interlayer 810 including highly doped semiconductor material to provide an ohmic contact. According to various embodiments, the dielectric layer 804 may include or may consist of diamond like carbon (DLC). The semiconductor layer 806 may include or may consist of silicon, e.g. p-type doped silicon or n-type doped silicon. According to various embodiments, the interlayer 810 may include or may consist of silicon, e.g. p-type doped silicon or n-type doped silicon, wherein the interlayer 810 may have the same doping type but a higher doping level than the semiconductor layer 806. The semiconductor layer 806 and the interlayer 810 may be provided in a carrier 812, wherein the carrier may have the opposite doping type as the semiconductor layer 806 and the interlayer 810.

Considering the equivalent circuit in reverse direction, the total conductance, G, is determined from the real part of the admittance and the total capacitance, C, is determined from the imaginary part of the admittance to:

$$C = \frac{R_S^2 C_S + R_B^2 C_B + \omega^2 R_S^2 R_B^2 C_S C_B \cdot (C_S + C_B)}{(R_S + R_B)^2 + \omega^2 R_S^2 R_B^2 \cdot (C_S + C_B)^2} \qquad (6)$$

and $$G = \frac{R_S + R_B + \omega^2 R_S R_B \cdot (R_S C_S^2 + R_B C_B^2)}{(R_S + R_B)^2 + \omega^2 R_S^2 R_B^2 \cdot (C_S + C_B)^2}. \qquad (7)$$

For low frequencies, ω, the total electrical conductance, G, and the total capacitance, C, approximate the following values:

$$C(\omega \to 0) = \frac{R_S^2 C_S + C_B^2 C_B}{(R_S + R_B)^2} \qquad (8)$$

and $$G(\omega \to 0) = \frac{1}{R_S + R_B}. \qquad (9)$$

The electrical conductance, G, approximate towards the static reciprocal value of the serial resistance of the space charge layer and the DLC-bulk in the limiting case of low frequencies (in the so called NF-case).

On the other hand, for high frequencies, ω, the total electrical conductance, G, and the total capacitance, C, approximate to the following values:

$$C(\omega \to \infty) = \frac{C_S C_B}{C_S + C_B} \qquad (10)$$

and $$G(\omega \to \infty) = \frac{R_S C_S^2 + R_B C_B^2}{R_S R_B \cdot (C_S + C_B)^2}. \qquad (11)$$

Therefore, the high frequency measurement may be used to determine the capacitance, $C_S$, of the bather layer.

Figure 9:
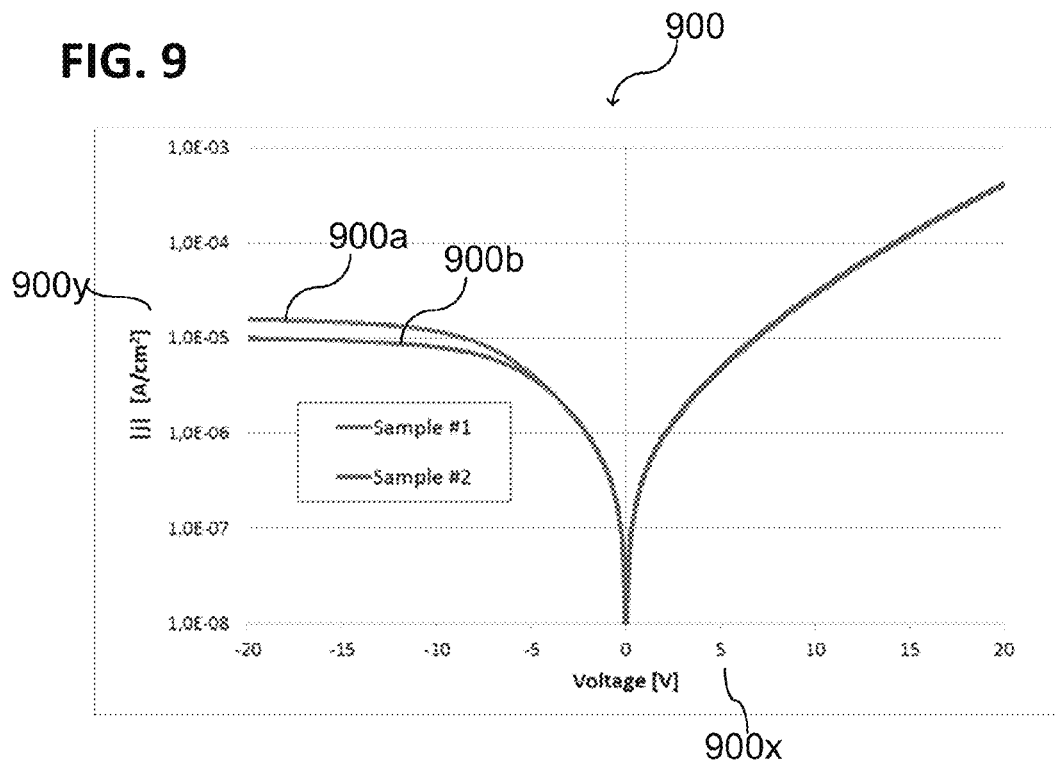
FIG. 9 illustrates the absolute value of the current density as a function of voltage of a metal insulator semiconductor test structure, according to various embodiments.

FIG. 9 illustrates (the absolute value of) the current density vs. voltage characteristic 900 (so called I-V-curves including absolute values of the current density) of the MIS-structure 600, 800, as for example illustrated in FIG. 6 or FIG. 8. As already described, the DLC layer in this example may be 300 nm thick, wherein the DLC layer may be deposited on a p-type doped silicon wafer that has a resistivity of about 8 Ωcm.

First of all, FIG. 9 illustrates the absolute value of the current density 900y as a function of voltage 900x of a metal insulator semiconductor test structure 600, 800 for two different in-situ pre-conditionings 900a, 900b that have been carried out prior to the DLC deposition respectively. A conventional plasma process including bias assisted reactive ion etching was used for a first sample #1 (cf. measurement curve 900a) to remove oxide residues and for etching the silicon surface (that serves as the interface to the DLC layer), wherein ion bombardment of the silicon surface (that serves as the interface to the DLC layer) was completely avoided for a second sample #2 (cf. measurement curve 900b) by using a remote plasma cleaning, as described herein. According to various embodiments, less electronic interface states may be formed due to the remote plasma cleaning, which results in a reduction of the leakage current, as illustrated in FIG. 9, by a factor of two compared to a conventionally used plasma cleaning process (note the logarithmic scale).

Figure 10:
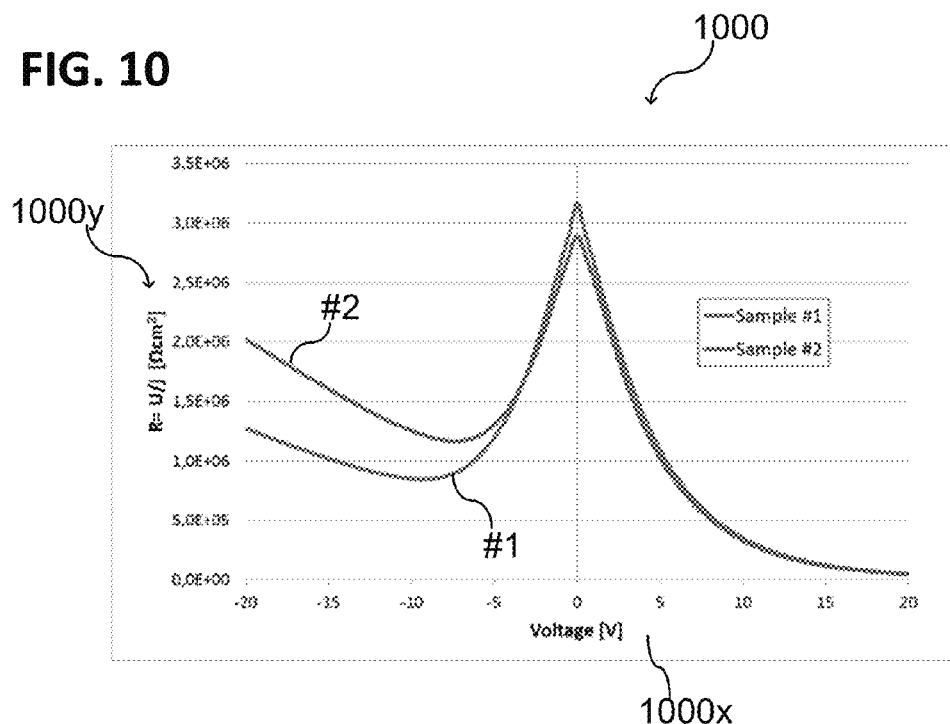
FIG. 10 illustrates the resistance as a function of voltage of a metal insulator semiconductor test structure, according to various embodiments.

As illustrated in FIG. 10, a resistance characteristic 1000 may be determined from the current-voltage characteristic 900 that is illustrated in FIG. 9. The resulting electrical resistance 1000y may be determined from the I-V-curves 900a, 900b as a function of the voltage 1000x that is applied to the MIS structure 600, 800. The polarity relates to the voltage that is applied to the ohmic contact 608, 808 of the MIS structure 600, 800.

While the current increase in forward direction follows the Poole-Frenkel-Law (cf. equation 1), there is a saturation behavior of the blocking voltage in the reverse direction, wherein the level of the saturation behavior may be defined in this case by generation at the surface states.

For an ideal Schottky contact, the value of the reverse current (also referred to as blocking current) depend exponentially on the barrier height, ΦB, with:

$$j_S = A * T^2 \cdot \exp\left(-\frac{q\Phi_B}{kT}\right), \tag{12}$$

wherein A* is the so called Richardson constant, wherein the value for A* is about 120 A/cm²K².

The barrier height, $\Phi_B$, of the DLC-Si-transition was determined in a separate test series by varying the doping level and by a corresponding measurement of the barrier layer capacity, $C_S$. The barrier height, $\Phi_B$, for p-type doped silicon is about 1.01 eV and the barrier height, $\Phi_B$, for n-type doped silicon is about 0.13 eV. For a p-type doped sample a leakage current (cf. equation 10) of about $1.4 \cdot 10^{-10}$ A/cm² may be expected.

Since the measured reverse current in the experiment is five orders of magnitude higher, it can be ascribed substantially to the surface generation (at least for p-type doped silicon substrates).

Under a complete depletion of the interface the generation current density may result in:

$$j_{gen} = q \cdot s_0 \cdot n_i \tag{13},$$

with the underlying definition for the surface recombination velocity of a depleted interface:

$$s_0 \equiv \frac{\pi}{2} \sigma_S v_{th} \cdot kTD_{ST}. \tag{14}$$

Regarding equations 13 and 14, $\sigma_s$ is the capture cross-section of the surface states, $v_{th}$ is the thermal velocity, and $D_{st}$ is the surface state density (also referred to as density of surface states). A surface recombination speed so of about 7150 cm/s and a surface state density, $D_{st}$, of about $3.5 \cdot 10^{13}$ cm⁻² eV⁻¹ correspond to sample #1 for the measured values of the saturation current density (cf. FIG. 9), wherein a surface recombination speed so of about 3680 cm/s and a surface state density, $D_{st}$, of about $1.8 \cdot 10^{13}$ cm⁻² eV⁻¹ correspond to sample #2. For this, a typical capture cross-section $\sigma_s$ for surface states of about $5 \cdot 10^{-16}$ cm² was assumed.

Compared to a MOS interface based on thermal oxide, the surface state density of sample #1 is comparatively high. Using a remote plasma pre-conditioning as carried out for sample #2, according to various embodiments, shows that for deposited dielectric layers (e.g. PECVD deposited DLC layers) the density of states can be reduced by a careful coordination of the pre-conditioning and the deposition process to at least reach the vicinity of a high quality MOS interface. The surface recombination velocity of a high quality MOS interface may be in the range from about a few ten to about a few hundred centimeters per second.

In the following, it will be described, under which boundary conditions an admittance measurement can be used for determining the surface density of states. As illustrated in FIG. 9 and FIG. 10, the bulk resistance $R_B$ may dominate the total resistance until the current reaches the saturation level of the Schottky junction under reverse bias. From here, the further voltage drop may be commutated on the serial resistance of the space-charge region and $R_S$ increases continuously with increasing reverse voltage. The total resistance is therefore characterized by a local minimum. Under the present boundary conditions there is a value of about (in the order of magnitude) 1 MΩ cm², at which $R_S$ equals approximately $R_B$.

This behavior is reflected in the conductance of the low frequency measured admittance. For this measurement, a LCR-Meter HP 4284A may be used, according to various embodiments, which includes a frequency range from about 20 Hz to about 1 MHz. A preferably low frequency measurement may allow to reach the range of validity of equation 9 and, further, to suppress the AC-part of the conductivity (cf. equation 3) in the measurement, which distorts the bulk resistance value compared to static measurements.

Figure 11:
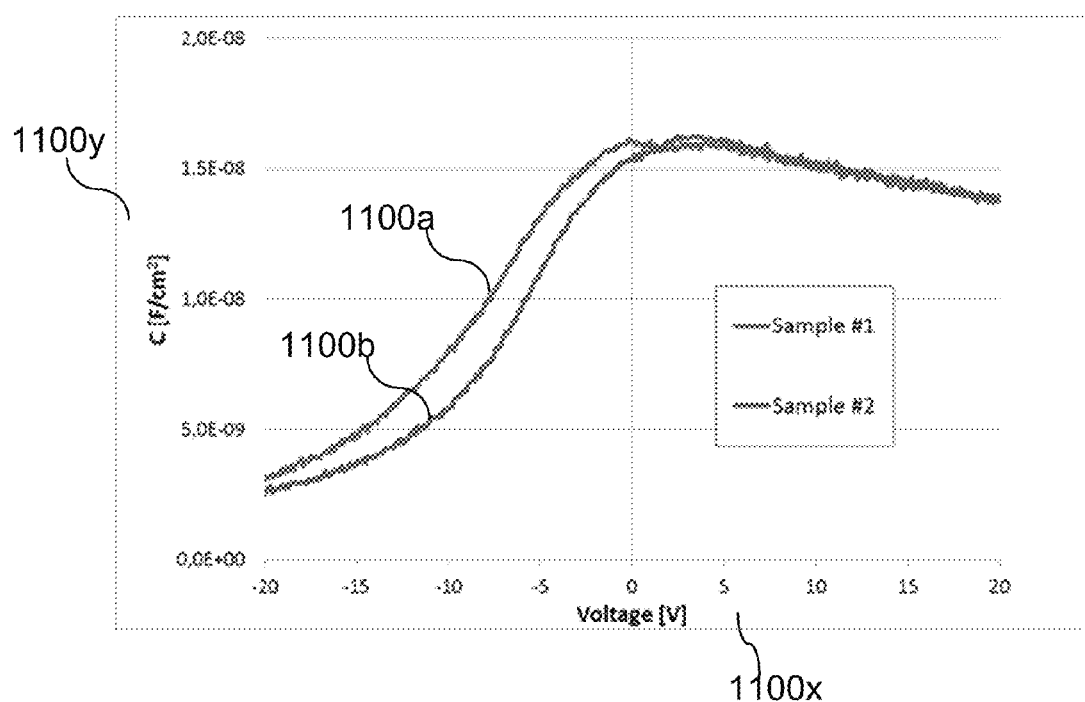
FIG. 11 illustrates the imaginary part of an admittance measurement, according to various embodiments.
Figure 12:
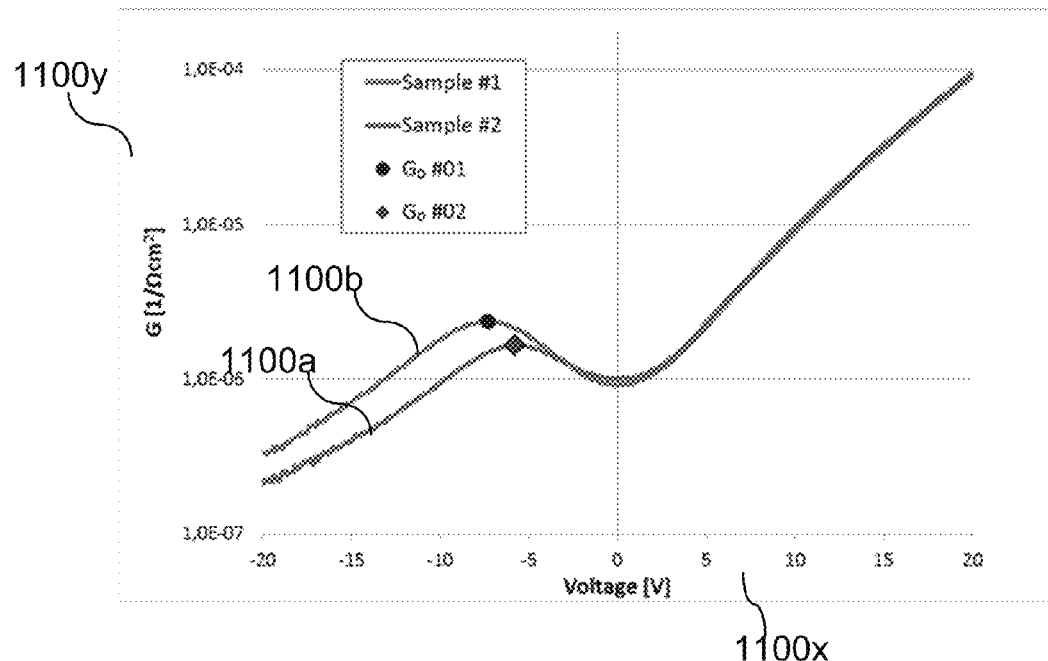
FIG. 12 illustrates the real part of an admittance measurement, according to various embodiments.

FIG. 11 and FIG. 12 respectively illustrate an admittance measurement carried out on the MIS structure 600, 800, as already described, wherein the imaginary part, that means the capacitance, C, is plotted in FIG. 11, and wherein the real part, that means the conductance, G, is plotted in FIG. 12.

Thereby, the values for C (1100y) and G (1200y) measured at a frequency of about 20 Hz are illustrated for both samples #1 (1100a, 1200a), #2 (1100b, 1200b) as a function of the voltage 1100x, 1200x. The dielectric capacitance $C_B$ is about $1.6 \cdot 10^{-8}$ F/cm² in case of accumulation. According to equation 4, this corresponds to DLC layer thickness of about 300 nm and $\in_r$ of about 5.5. According to equation 8, the total capacitance C decreases in the case of depletion due to the (with increasing voltage) decreasing space charge layer capacitance, $C_S$.

This drop (with decreasing voltage 1100x, 1200x) occurs later for sample #1, which indicates the influence of the higher surface state density on the threshold voltage for the onset of depletion. The behavior of the conductance, G, corresponds to the expected (cf. equation 9) reciprocal behavior of the statically measured resistance. The local minimum of the resistance in FIG. 10 is reflected in FIG. 12 as a local maximum in the conductance.

In order to investigate, for which frequencies the NF-case can be assumed, and therefore, for which frequencies equations 8 and 9 are valid, the experimentally obtained values are subjected to a model calculation. The further values that result from the experiment are $C_B = 1.6 \cdot 10^{-8}$ F/cm² and $C_S = 8 \cdot 10^{-9}$ F/cm².

Figure 13:
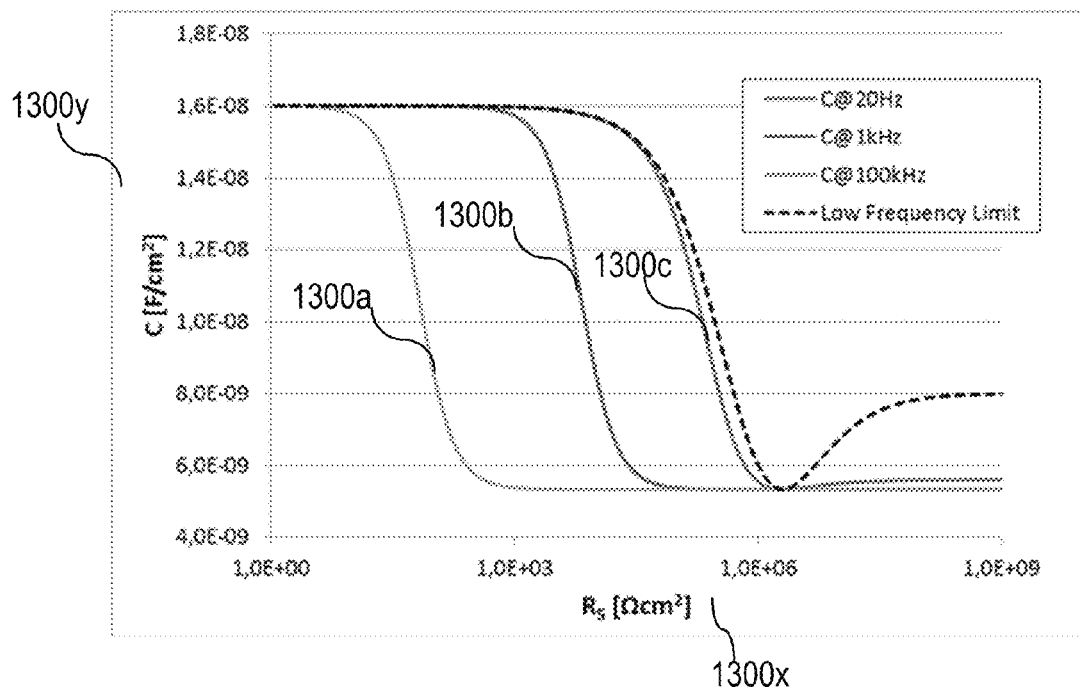
FIG. 13 illustrates a calculated capacitance behavior (imaginary part), according to various embodiments at different frequencies.
Figure 14:
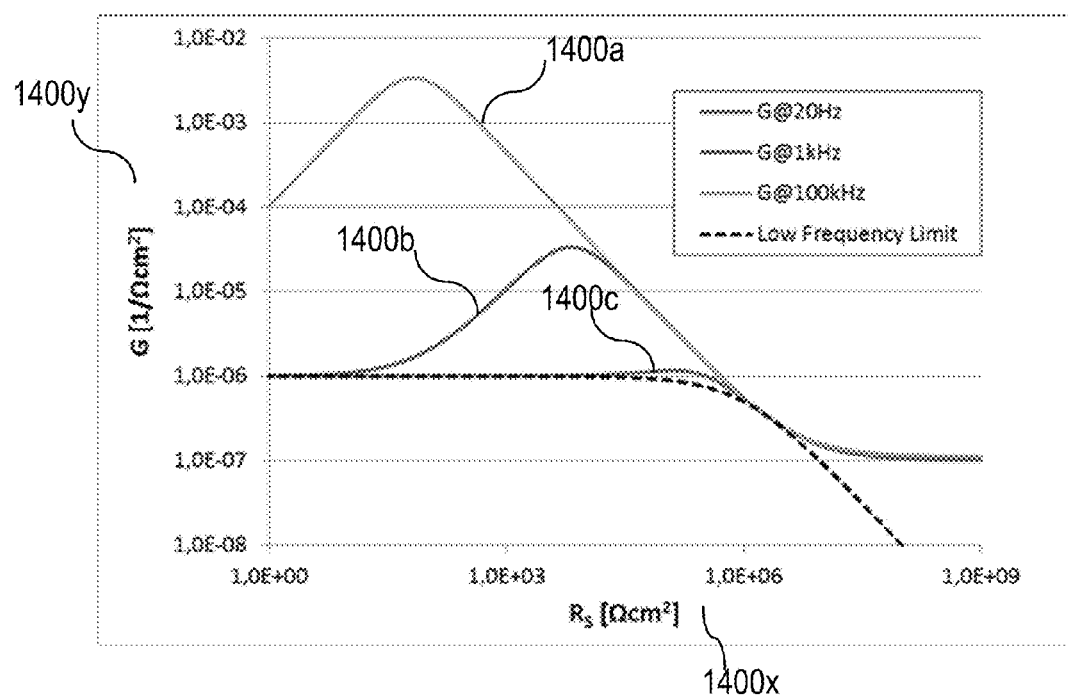
FIG. 14 illustrates a calculated conductance behavior (real part), according to various embodiments at different frequencies.

FIG. 13 and FIG. 14 respectively illustrate the behavior of the capacitance 1300y and the conductance 1400y under variation of the resistance $R_S$ (1300x, 1400x) for three different measurement frequencies (20 Hz for 1300c, 1400c;

1 kHz for 1300*b*, 1400*b*; and 100 kHz for 1300*a*, 1400*a*) according to equations 6 and 7.

FIG. 13 illustrates the calculated C-behavior based on equation 6 for variations of $R_S$ for the boundary conditions determined from the previous measurements. The dashed curve represents the NF-case according to equation 8.

FIG. 14 illustrates the corresponding G-behavior according to equation 7. The dashed curve represents the NF-case according to equation 9.

The values for the C-behavior and G-behavior were calculated for a measurement frequency of 100 kHz, 1 kHz, and 20 Hz respectively. As illustrated, the value of the dielectric capacitance results for low $R_S$-values (accumulation) in all three cases and the value of the dielectric capacitance approximate for higher $R_S$-values towards the high-frequency value according to equation 10, actually faster for higher frequencies. Further, it is illustrated that the NF-case for high $R_S$-values results at very low frequencies. The NF-case is reached for the 20 Hz measurement, as can be seen from the increasing capacitance towards the NF-value according to equation 8 with decreasing measurement frequency. In analogy, an additional resonance is expected for the conductance at high frequencies, which arises, if the barrier layer resistance, $R_S$, reaches the value of about $R_S \approx 1/\omega C_B$. This additional resonance can be completely suppressed only at frequencies below about 20 Hz, in other words, in the so called NF-case. Particularly the section, in which the reverse voltage commutates to $R_S$ (characterized by the drop in the conductance), can be well approximated for the 20 Hz measurement.

As a result, the maximal value of $G_0$ that is measured at 20 Hz in reverse polarity may be used for determine the reverse current density (cf. FIG. 12). Together with the voltage value $U_0$ at this point, it is:

$$j_{gen} \approx G_0 \cdot U_0 \tag{14}$$

The values obtained thereby match the reverse current densities obtained from static measurements.

Figure 15:
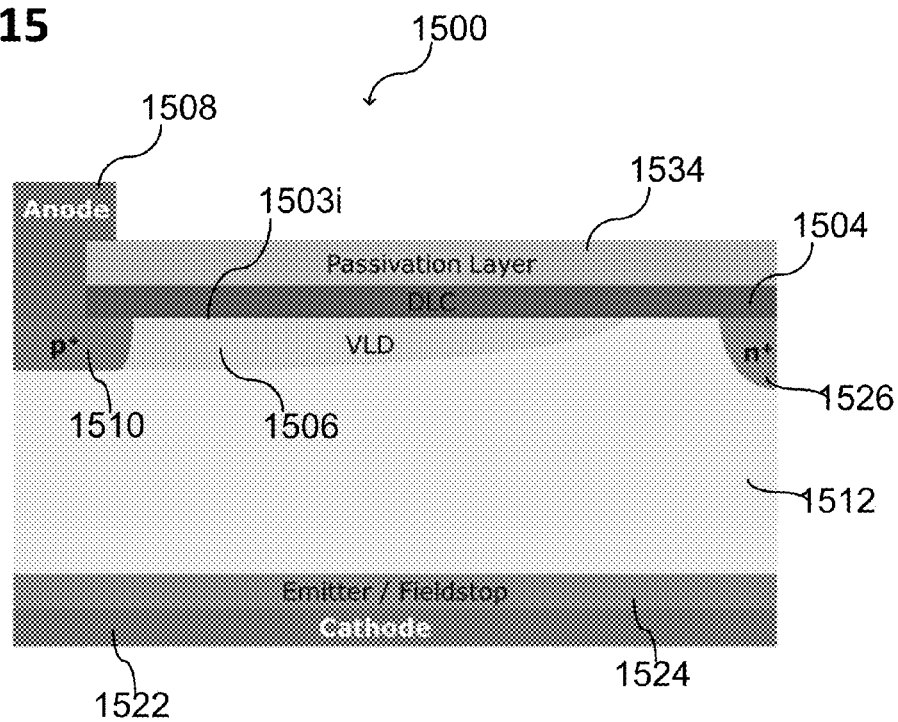
FIG. 15 illustrates a cross sectional view of a high voltage component, according to various embodiments.

FIG. 15 illustrates a cross sectional view of a high voltage component 1500 (also referred to as high voltage electronic device or power device), e.g. working at operation voltages greater than about 1000 V, wherein the high voltage component 1500 includes a VLD-edge termination (VLD, Variation of Lateral Doping), according to various embodiments. The structure of the high voltage component 1500 may be similar to the structure of the MIS test structures 600, 800, as described herein. More specifically, patterning the high voltage component 1500 (e.g. the DLC layer 1504 and the passivation layer 1534) and electrically contacting the patterned high voltage component 1500 may allow to provide a lateral MIS test structure 800, as described herein.

According to various embodiments, the high voltage component 1500 may include a semiconductor carrier 1512 with a VLD region 1506 (in other words a semiconductor layer 1506), an ohmic contact coupled to the VLD region 1506. The VLD region 1506 may be at least partially covered (e.g. completely covered) with a dielectric layer 1504. The high voltage component 1500 may further include, e.g. optionally, a passivation layer 1534 disposed over the dielectric layer 1504.

According to various embodiments, the ohmic contact may include an interlayer 1510 including highly doped semiconductor material and a metal contact 1508 (e.g. an anode) to provide an ohmic contact to the VLD region 1506. According to various embodiments, the dielectric layer 1504 may include or may consist of diamond like carbon (DLC). The semiconductor layer 1506 may include or may consist of silicon, e.g. p-type doped silicon or n-type doped silicon. According to various embodiments, the interlayer 1510 may have a higher doping level than the semiconductor layer 1506. The carrier 1512 may include the opposite doping type as the semiconductor layer 1506 and the interlayer 1510.

Further, the high voltage component 1500 may include an emitter and/or fieldstop layer 1524 and a cathode 1522 at the backside of the high voltage component 1500. According to various embodiments, the high voltage component 1500 may be configured as a transistor, e.g. as insulated gate bipolar transistor (IGBT). According to various embodiments, the emitter and/or fieldstop layer 1524 may include for example highly doped silicon of the same doping type as the carrier 1512. Further, the high voltage component 1500 may include a channel stop region 1526 including for example highly doped silicon of the same doping type as the carrier 1512.

The reverse current densities obtained from measurements of the MIS test structures 600, 800 can be transferred to reverse current values, as can be measured, for example, at a high voltage device (or high voltage component) with a VLD edge termination including a DLC passivation layer, as described herein. An edge width of about 2 mm may be necessary for a 6.5 kV device, wherein about 1.25 mm relates to the width of the VLD area 1506, over which the space-charge zone extends at the surface in case of an applied reverse voltage.

Figure 16:
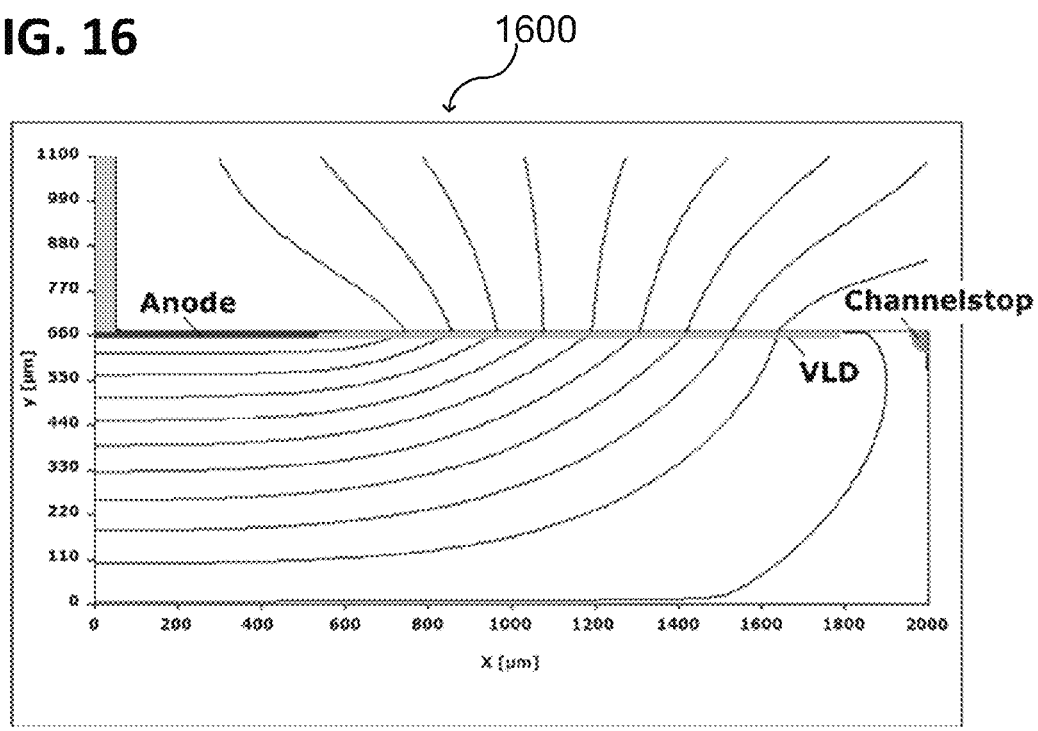
FIG. 16 illustrates a numerical simulation of the potential distribution of a high voltage component, according to various embodiments.

Due to the contact potential at the amorphous-crystalline DLC-Si-transition (that results from the Schottky barrier, as described herein) a positive charge density is formed at the interface 1503*i* in the range of $4 \cdot 10^{11}$ elementary charges/cm$^2$, that causes a retrograde form of the space charge zone boundary in the n-type doped base region 1512 towards to surface. Therefore, the space charge zone ends at the semiconductor surface in fact at the end of the VLD region 1506. The results of a numerical simulation 1600 calculating the potential distribution at a breakthrough voltage of about 7580 V, which takes this into account, is illustrated in FIG. 16.

Taking also the size of the chip into account, e.g. about 1 cm$^2$, an area of about 0.5 cm$^2$ may result for the depletion zone at the semiconductor surface at full reverse voltage. Therefore, a reverse current may be expected that reaches half of the value of the reverse current density discussed with reference to FIG. 9.

Figure 17:
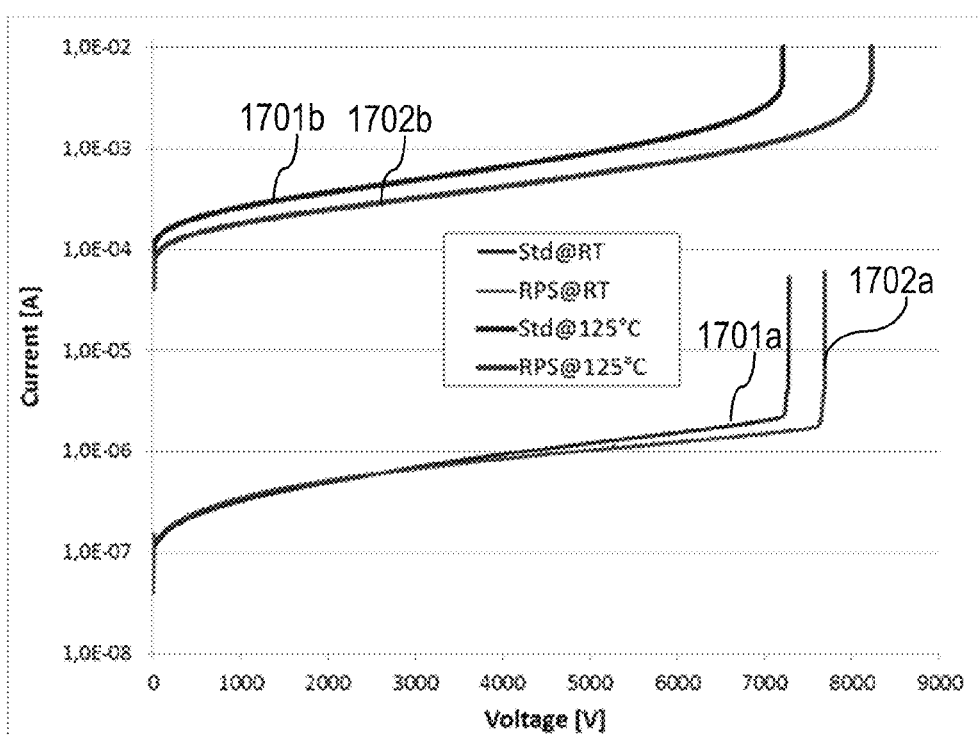
FIG. 17 illustrates a current-voltage characteristic of a high voltage component, according to various embodiments.

FIG. 17 illustrates a reverse characteristic measurement 1700 of a 6.5 kV-IGBT at room temperature, e.g. at 20° C., (curves 1701*a*, 1702*a*) and at 125° C. (curves 1701*b*, 1702*b*) for different pre-conditionings (curves 1701*a*, 1701*b* for a conventionally used plasma treatment and curves 1702*a*, 1702*b* for a remote plasma treatment).

The values at room temperature correspond to the expected values according to the assessment. The same applies to the measurement at 125° C., which shows the effect more clearly and emphasizes the potential of a reduction of the leakage current at higher operating temperatures by using an RPS pre-clean during manufacture. Also the reverse (blocking) voltage increases due to the low leakage current, since the lower reverse (blocking) power dissipation causes a delayed begin of the thermal drift, wherein the thermal drift may be cause by a limited cooling of the wafer.

In the following, a second embodiment may be described, referring to a MOS capacity.

Figure 18:
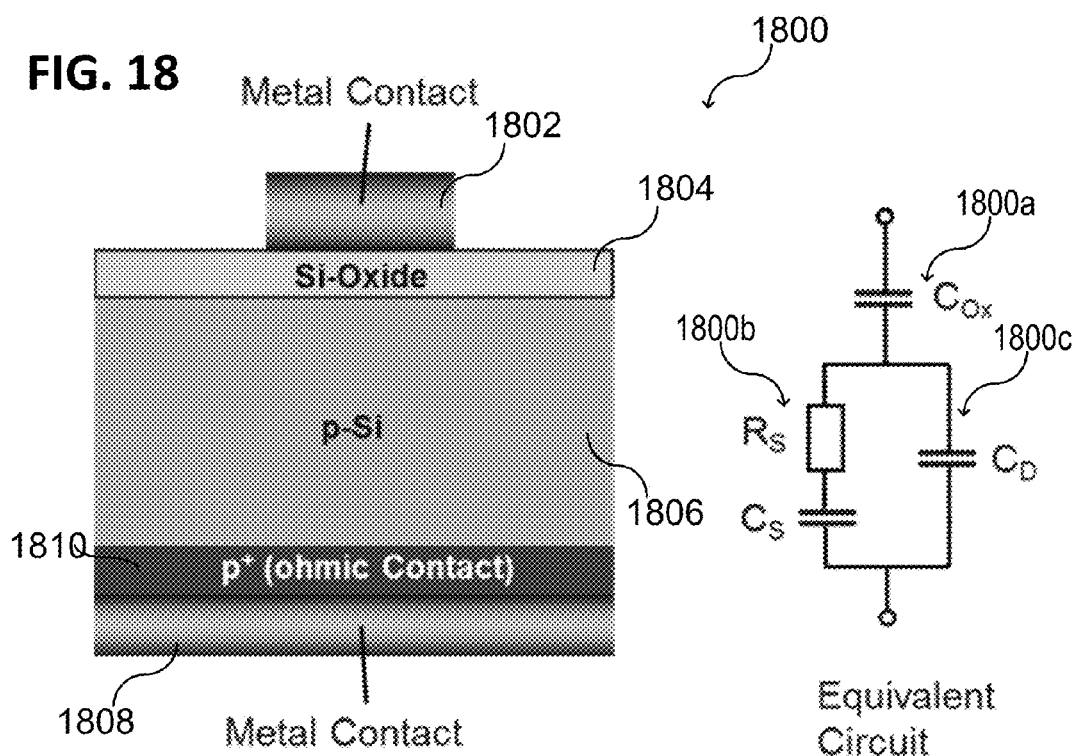
FIG. 18 illustrates a schematic setup for measuring the admittance of a MOS structure and the corresponding equivalent circuit, according to various embodiments.

FIG. 18 illustrates a schematic setup for measuring the admittance of a MOS structure (left side of FIG. 18) and the corresponding equivalent circuit (right side of FIG. 18), according to various embodiments.

Illustratively, in analogy the MIS test structure 600, 800 described herein, a metal oxide semiconductor (MOS) test structure 1800, e.g. a MOS capacitor, may be used to measure and/or determine the admittance of a dielectric layer.

According to various embodiments, the MOS test structure 1800 may include a metal layer 1802 (also referred to as a first metal contact 1802), an electrically insulating layer 1804 (e.g. a dielectric oxide layer) and a semiconductor layer 1806. A second metal contact 1808 may be electrically connected to the semiconductor layer 1806, e.g. via an interlayer 1810 including highly doped semiconductor material to provide an ohmic contact. According to various embodiments, the dielectric layer 1804 may include or may consist of silicon oxide ($SiO_x$, e.g. $SiO_2$). The semiconductor layer 1806 may include or may consist of silicon, e.g. p-type doped silicon or n-type doped silicon. According to various embodiments, the interlayer 1810 may include or may consist of silicon, e.g. p-type doped silicon or n-type doped silicon, wherein the interlayer 1810 may have the same doping type but a higher doping level than the semiconductor layer 1806.

In this case, an ideal dielectric material (e.g. silicon oxide, $SiO_x$ with x about 2) is used having only a capacitive bulk behavior 1800a. The interface states may be described by at least one RC-element 1800b coupled in parallel to the depletion capacity 1800c. This description of the MOS interface goes back to Nicollian and Goetzberger. The equivalent circuit illustrated in FIG. 18 may lead to the following correlations for the total admittance:

$$C = \frac{C_{Ox} \cdot (C_D + C_S) \cdot (C_{Ox} + C_D + C_S) + \omega^2 R^2 C_S^2 C_{Ox} C_D \cdot (C_{Ox} + C_D)}{(C_{Ox} + C_D + C_S)^2 + \omega^2 R^2 C_S^2 \cdot (C_{Ox} + C_D)^2} \quad (15)$$

and $$G = \frac{\omega^2 R C_{Ox}^2 C_S^2}{(C_{Ox} + C_D + C_S)^2 + \omega^2 R^2 C_S^2 \cdot (C_{Ox} + C_D)^2}. \quad (16)$$

For higher frequencies C and G approximate towards the following values:

$$C(\omega \to \infty) = \frac{C_{Ox} \cdot C_D}{(C_{Ox} + C_D)} \quad (17)$$

and $$G(\omega \to \infty) = \frac{C_{Ox}^2}{R \cdot (C_{Ox} + C_D)^2}. \quad (18)$$

On the other hand, for low frequencies C and G approximate towards the following values:

$$C(\omega \to 0) = \frac{C_{Ox} \cdot (C_D + C_S)}{(C_{Ox} + C_D + C_S)} \quad (19)$$

and $$G(\omega \to 0) = 0. \quad (20)$$

After subtracting the series impedance, $C_{Ox}$, or in the case $C_{Ox} \to \infty$, finally, results:

$$C = C_D + \frac{C_S}{\omega^2 C_S^2 R^2 + 1} \quad (21)$$

and $$G = \frac{\omega^2 C_S^2 R}{\omega^2 C_S^2 R^2 + 1}. \quad (22)$$

Figure 19:
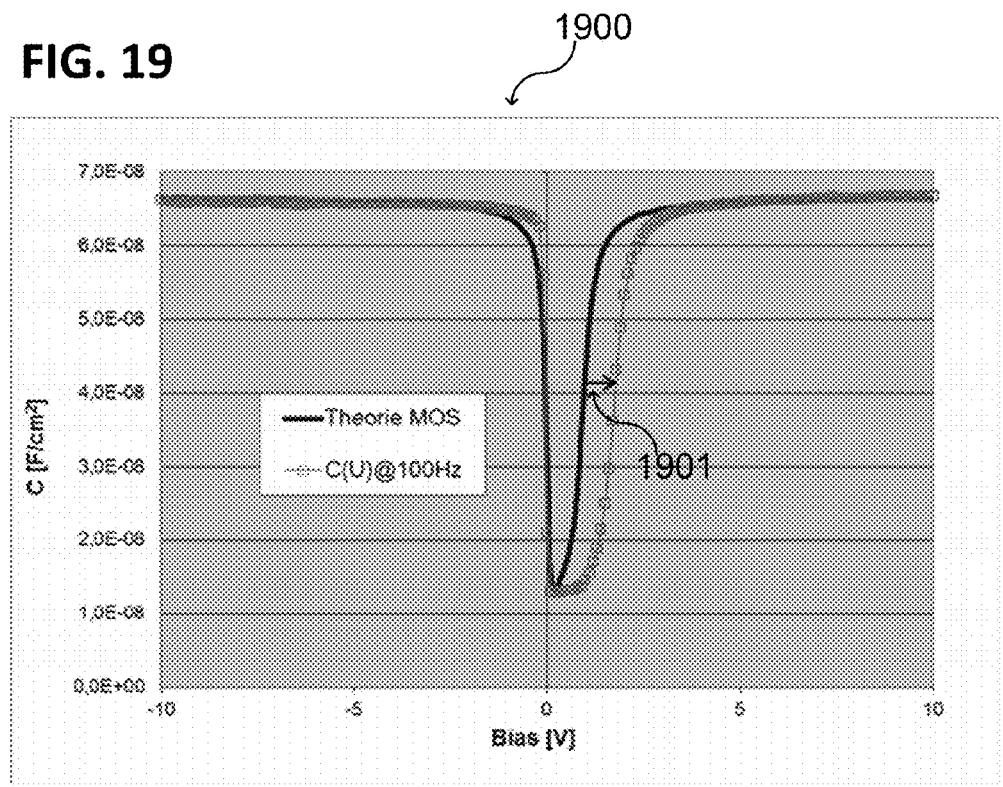
FIG. 19 illustrates a measurement of a metal oxide semiconductor capacitance, according to various embodiments.
Figure 20:
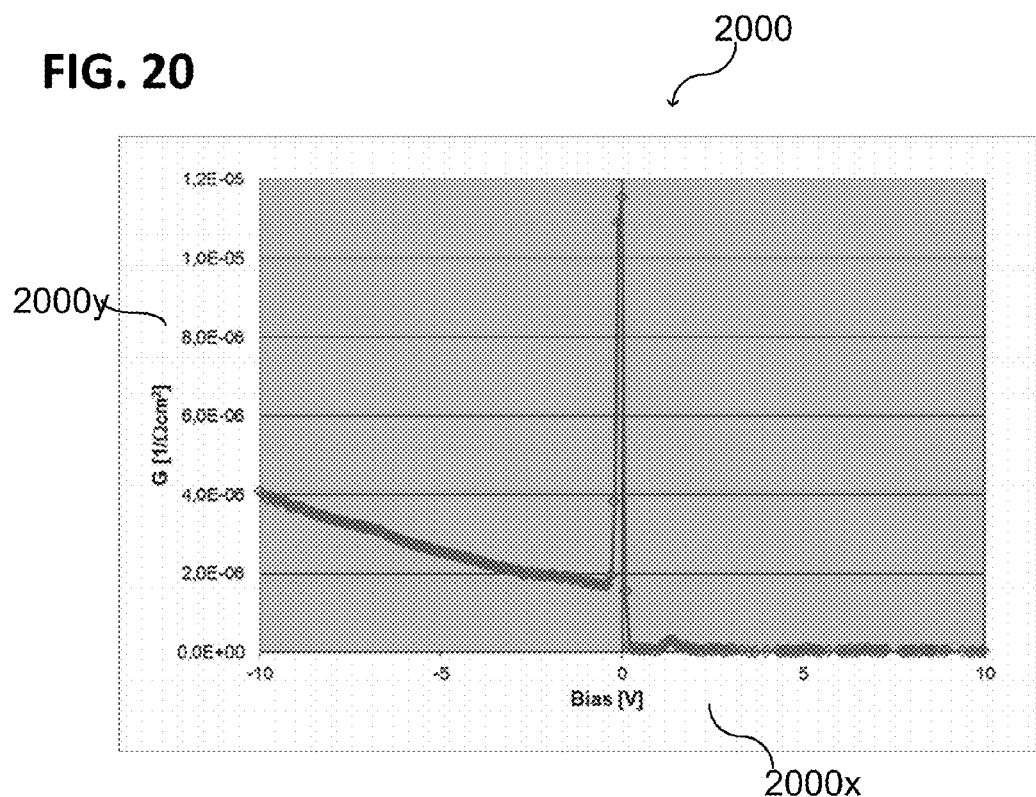
FIG. 20 illustrates a conductance measurement of a metal oxide semiconductor capacitor, according to various embodiments.

FIG. 19 and FIG. 20 respectively illustrate the determined measured values for C and G that were measured on a MOS test structure 1800, as illustrated in FIG. 18, at a measurement frequency of about 100 Hz, according to various embodiments. The measured MOS test structure 1800 was formed on a p-type doped silicon wafer having a specific resistance of about 8 Ωcm. In this case, the dielectric material includes a 53 nm thick oxide layer that has been grown by thermal oxidation. Here, a process has been used for manufacturing the MOS test structure 1800, corresponding to conventionally used manufacturing process for gate oxides in MOS devices. Titanium contacts may be used for electrically contacting the oxide layer, wherein the titanium contacts are provided with a diameter of about 1 mm. The backside of the MOS test structure 1800 is electrically contacted with an aluminum metallization.

FIG. 19 illustrates a measurement 1900 of a MOS capacity including a measured capacity curve (denoted by squares) and the expected capacity curve according to the theory for the low-frequency limit, the so called NF-case (denoted by solid line).

FIG. 20 illustrates a measurement 2000 of a MOS capacity including the conductance 2000y as a function of applied voltage 2000x. The minority charge carrier thermally generated by inversion may contribute to the signal in the NF-case (in contrast to a high frequency measurement). This means, that $\omega^{-1}$ is greater than the characteristic time constant for the generation-recombination rate.

This is typically at frequencies equal or less than 100 Hz the case. In this case, the conduction band is increasingly occupied with electrons upon onset of the strong inversion due to band bending at the $Si/SiO_2$-interface.

The electrons provide the opposite charge to the charges on the gate electrode, so that, after the initial drop of the capacitance to the maximum depletion layer width, the total capacitance rises again upon a further increase of the reverse voltage, and reaches the value that is predetermined by the oxide capacitance $C_{OX}$, as in the accumulation case:

$$C_{Ox} = \frac{\varepsilon_{Ox} \cdot \varepsilon_0}{d}, \quad (23)$$

with the value $\in_{Ox}=4$ and the thickness of the oxide layer of 53 nm there is a oxide capacitance $C_{Ox}=6.7 \cdot 10^{-8}$ F/cm², which corresponds to the maximum value of the measured capacitance.

In comparison with the theoretical prediction, the measured capacitance curve is broader when passing through the minimum (cf. FIG. 19). This may be caused by the influence of the interface charges which are also contributing to the resonance in the conductance at the change from depletion to accumulation. Therefore, the threshold voltage for accumulation is shifted 1901 by ΔU of about 0.8 V.

The conductance background that is illustrated in FIG. 20 during inversion operation is attributable to the generation/recombination contribution of the minority charge carrier that is increasing for increasing reverse (blocking) voltage.

The shift of the threshold voltage corresponds to an interface charge density, $N_{SS}$, of about $3.5 \cdot 10^{11}$ charges/cm² according to the MOS-theory and leads according to:

$$C_S = \frac{qN_{SS}}{\Delta U} \quad (24)$$

to an interface capacitance, $C_S$, of about $7 \cdot 10^{-8}$ F/cm² and with:

$$D_{ST} = \frac{C_S}{q^2} \quad (25)$$

finally to an interface state density, $D_{st}$, of about $4.4 \cdot 10^{11}$ cm⁻² eV⁻¹.

According to the model of Nicollian and Gotzberger, the interface state density, $D_{st}$, may be determined (e.g. calculated) directly from the conductance after subtracting the series impedance. This may be carried out by a transformation into the impedance-plane, the subtraction of the series impedance $1/\omega C_{Ox}$, and back-transformation into the admittance-plane. Afterwards, C and G include only terms, which can be represented by the equations 21 and 22. In this case, G only includes the properties of the interface R and $C_S$ without the depletion capacitance, so that $C_S$ results immediately from the resonance of a G/ω-plot.

According to equation 22, G/ω has a maximum in the following case:

$$\omega \cdot R \cap C_S = 1 \quad (26).$$

This case results in:

$$\left. \frac{G}{\omega} \right|_{max} = \frac{C_S}{2}. \quad (27)$$

This procedure may be also referred to as conductance method and is explained in more detail for the present case on the basis of a model calculation.

Figure 21:
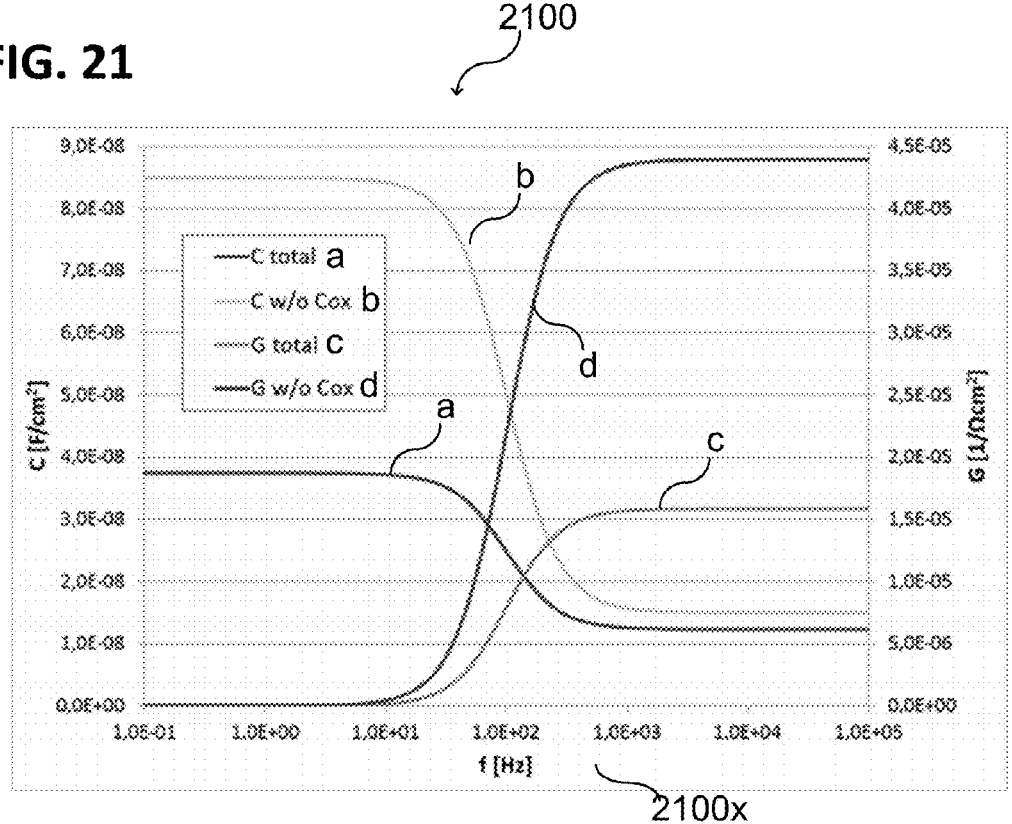
FIG. 21 illustrates a calculated behavior of the admittance of a metal oxide semiconductor capacitor, according to various embodiments.

The value $C_{Ox} = 6.7 \cdot 10^{-8}$ F/cm² may be known from the measurement and the depletion capacitance, $C_D$, which results in the maximal depletion layer width in case of strong inversion, can be calculated for the 8 Ωcm p-type doped substrate in accordance to the MOS-theory, which gives a value for $C_D$ of about $1.5 \cdot 10^{-8}$ F/cm². R can be determined from the resonance condition (cf. equation 26) if the estimated value for $C_S$ of about $7 \cdot 10^{-8}$ F/cm² is used. The capacitance and the conductance, illustrated in FIG. 21, may be determined under these boundary conditions from equations 15 and 16 and are plotted as a function of the frequency 2100x. Further, FIG. 21 also includes the behavior that results from equations 21 and 22 without $C_{Ox}$. A conductance is measured at a frequency of about 100 Hz that is in the same order of magnitude as obtained from calculation. The comparison also shows that the oxide capacity, $C_{Ox}$, leads to a (e.g. frequency depended) damping of the conductance and the capacitance for the interface terms.

Figure 22:
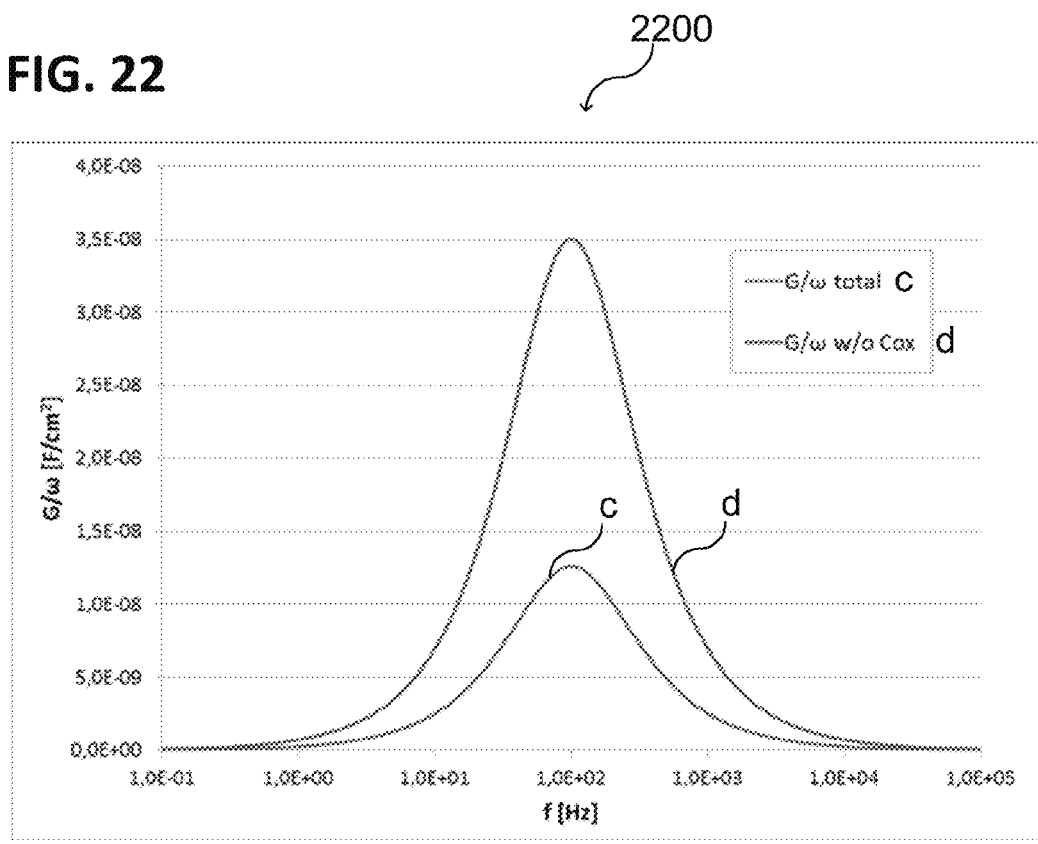
FIG. 22 illustrates the $G/\omega$-behavior of a metal oxide semiconductor capacitor, according to various embodiments.

FIG. 22 illustrates a G/ω-plot 2200 of a MOS capacity with and without the oxide capacity, $C_{Ox}$, according to various embodiments. The G/ω-plot 2200 is illustrated in FIG. 22 for the conductance values of the conductance-plot 2100 illustrated in FIG. 21, wherein the respective maximal value may correspond to the interface state density.

In this measurement, under these boundary conditions, a reduction of the maximal value of about 40% may be expected due to the damping. Using the measured value for $G_{max}$ of about $1.1 \cdot 10^{-5}$ (Ωcm²)⁻¹ and applying a correction due to the damping, the correction leads to a maximal value for $G_{max}$ of about $2.7 \cdot 10^{-5}$ (Ωcm²)⁻¹. From equation 27 results a density of states, $D_{ST}$, of about $5.4 \cdot 10^{11}$ cm⁻² eV⁻¹, wherein the evaluated density of states fits to the value that can be estimated from the shift 1901 of the threshold voltage (cf. FIG. 19).

A surface recombination speed, so, of about 110 cm/s as well as a generation current density, $j_{gen}$, of about $10^{-7}$ A/cm² may be calculated from equations 13 and 14 for the thermally oxidized silicon surface. These values are more than one order of magnitude lower than the values obtained for the DLC-Si-interface, in particular to sample #1, which shows the potential for improvement by avoiding crystal damages at the surface of the semiconductor.

In addition to the pre-clean that may be carried out by a remote plasma source, as described before, a soft deposition of the dielectric material, e.g. using PECVD, may be carried out. A soft deposition process, as already described, may be configured to avoid a high momentum transfer of the ions to the semiconductor crystal.

Further, the deposition of the dielectric material, e.g. using PECVD, may be configured to incorporate hydrogen, that arises from the used precursor materials, into the layers and into the interface, wherein in this case free valences may be saturated, similar to a thermal oxidation process. Particularly, $CH_4$ may be used as precursor material for depositing an amorphous dielectric layer including silicon and carbon, e.g. a-Si,C:H, since this precursor includes sp³-hybridized carbon and has the highest ratio of hydrogen to carbon among volatile hydrocarbons. Therefore, dense and hard a-Si,C:H layers may be deposited in the PECVD reactor type, as described herein (cf. for example FIG. 3), using $CH_4$ as carbon and hydrogen source. However, using other precursor materials, as for example $C_2H_4$ or $C_2H_2$, larger quantities of SiH and CH species may be incorporated into the layers. In particular, more π-electrons will be present in the deposited layer if precursor material is used including a π-bonding contribution.

Figure 23:
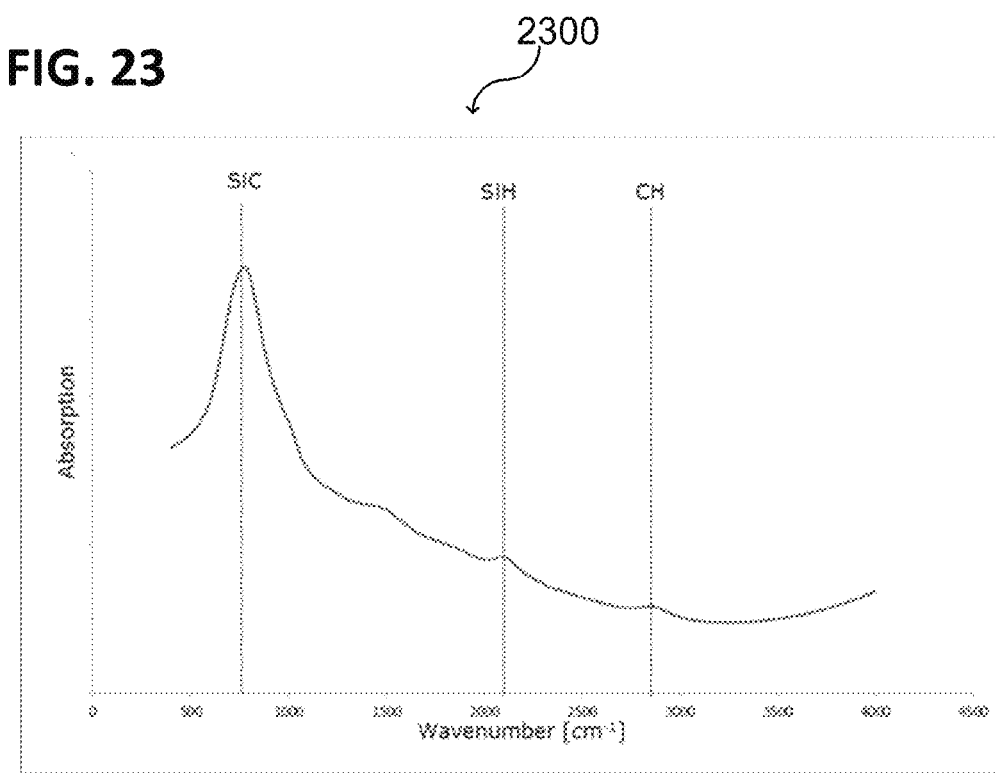
FIG. 23 illustrates an infrared absorption spectrum of a PECVD grown amorphous layer including silicon and carbon, according to various embodiments.

FIG. 23 illustrates an infrared spectrum 2300 of an a-Si,C:H layer, according to various embodiments. The infrared spectrum includes corresponding hydrogen-correlated absorption bands. In general, the infrared spectroscopy may be suitable for distinguishing thermally grown dielectric materials, e.g. conventionally grown silicon oxide, from PECVD grown silicon oxide.

Figure 24:
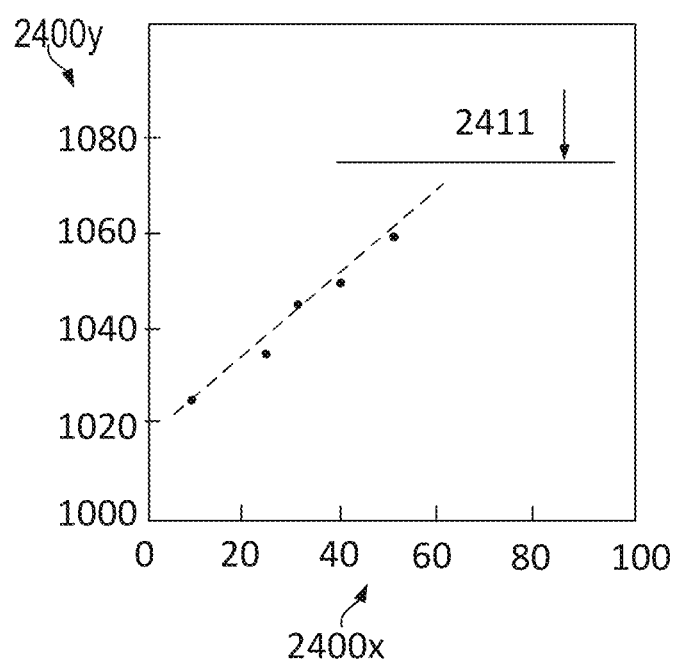
FIG. 24 illustrates a variation of stoichiometry of silicon oxide layers due to using helium during a PECVD deposition of the respective silicon oxide layer, according to various embodiments.

According to various embodiments, the stoichiometry of a plasma oxide may be optimized towards thermally grown oxide by adding helium to the processing gas mixture. FIG. 24 illustrates a variation of a stoichiometry (represented by the Si—O—Si stretching frequency 2400y) of a silicon oxide layer due to using helium (plotted in volume percentage 2400x) during a PECVD deposition of the silicon oxide layer, according to various embodiments. However, a typical position 2411 of the Si—O—Si stretching frequency of about 1080 cm⁻¹ that can be observed for thermally grown oxide may not be reached with a plasma assisted deposited oxide (also referred to plasma oxide). Further, an absorption band with a value of about 3445 cm⁻¹ that is typical for Si—NH may be observed for PECVD-silane-oxides that are deposited with a processing gas mixture (also referred to precursor material) of $N_2O/SiH_4$. In general, using spectroscopy may allow to identify the type of deposition process that was used for forming a dielectric layer based on, for example, IR-spectroscopy and Raman-spectroscopy.

According to various embodiments, a conventional semiconductor technology PECVD chamber may be combined with an in-situ remote plasma pre-conditioning or pre-cleaning to form a high quality semiconductor/dielectric interface.

Basically, high resolution transmission electron microscopy (HRTEM) may be used to investigate the interface between a dielectric (e.g. deposited silicon oxide, deposited amorphous silicon, deposited amorphous carbon, etc.) and a semiconductor (e.g. silicon). Conventionally grown PECVD oxides, e.g. without using a pre-conditioning as described herein, may have native oxide at the silicon-dielectric interface.

According to various embodiments, the absence of such a native oxide between the semiconductor substrate and the PECVD grown dielectric may point towards a pre-conditioning, as described herein, according to various embodiments.

The type of dielectric and the used manufacturing method may be detected by IR spectroscopy or Raman spectroscopy. The existence of oxide at the semiconductor-dielectric interface may be detected via HRTEM.

Further, an electronic component or an electronic device including, for example, a low-doped p-zone in the edge termination, e.g. variation of lateral doping (VLD), junction termination extension (JTE), or reduced surface field (RESURF), may be modified (e.g. by forming a metal contact over the dielectric/passivation layer, cf. FIGS. 8 and 15) to provide a lateral test structure for characterizing the interface, as described herein. This may allow a characterization of the semiconductor/dielectric interface for a readily processed electronic device or electronic component.

According to various embodiments, an electronic device including, for example, an edge termination with a low-doped region, e.g. a variation of lateral doping (VLD) edge termination, a junction termination extension (JTE) edge termination, or reduce surface field (RESURF) edge termination may be formed by the method 100, 200, 400, as described herein.

According to various embodiments, a method for processing a semiconductor layer may include: generating an etch plasma in a plasma chamber of a remote plasma source, wherein the plasma chamber of the remote plasma source is coupled to a processing chamber for processing the semiconductor layer; introducing the etch plasma into the processing chamber to remove a native oxide layer from a surface of the semiconductor layer and at most negligible removing semiconductor material of the semiconductor layer; and, subsequently, depositing a dielectric layer directly on the surface of the semiconductor layer. In analogy, according to various embodiments, a method for processing a semiconductor wafer may include: generating an etch plasma in a plasma chamber of a remote plasma source, wherein the plasma chamber of the remote plasma source is coupled to a processing chamber for processing the semiconductor wafer; introducing the etch plasma into the processing chamber to remove a native oxide layer from a surface of the semiconductor wafer and at most negligible removing semiconductor material of the semiconductor wafer; and, subsequently, depositing a dielectric layer directly on the surface of the semiconductor wafer.

According to various embodiments, a method for processing a semiconductor layer may include: generating an etch plasma in a plasma chamber of a remote plasma source, wherein the plasma chamber of the remote plasma source is coupled to a processing chamber for processing the semiconductor layer; introducing the etch plasma into the processing chamber to remove a native oxide layer from a surface of the semiconductor layer and at most a negligible amount of semiconductor material of the semiconductor layer; and, subsequently, depositing a dielectric layer directly on the surface of the semiconductor layer.

According to various embodiments, the dielectric layer may be deposited by one of chemical vapor deposition or physical vapor deposition. In other words, the dielectric layer may be a deposited dielectric layer, in contrast to a thermally grown dielectric layer.

According to various embodiments, the dielectric layer may be deposited by plasma-enhanced chemical vapor deposition (PECVD).

According to various embodiments, the dielectric layer may be deposited by chemical vapor deposition using a hydrogen containing precursor. According to various embodiments, the dielectric layer may be deposited by chemical vapor deposition using methane and/or silane as precursor.

According to various embodiments, the dielectric layer may be deposited by sputter deposition.

According to various embodiments, the dielectric layer may include at least one of a carbon based dielectric material or a silicon based dielectric material.

According to various embodiments, the etch plasma may be generated in the plasma chamber of the remote plasma source from a halogen containing gas that is provided to the plasma chamber of the remote plasma source with a gas flow rate of less than 100 sccm. The unit sccm, standard cubic centimeters per minute, may refer to standard conditions for temperature, T, and pressure, p, with T=0° C. and p=1013.25 hPa.

According to various embodiments, the semiconductor layer may include silicon and the halogen containing gas may include fluorine. According to various embodiments, the semiconductor layer may be a silicon wafer and the halogen containing gas may be $NF_3$. According to various embodiments, the halogen containing gas may be diluted with a noble gas.

According to various embodiments, a method for processing a silicon substrate may include: bringing the silicon substrate into a processing region of a processing chamber; providing a vacuum in the processing region; pretreating at least one surface of the silicon substrate using an etch plasma that is provided in the processing region by a remote plasma source coupled to the processing chamber, wherein the etch plasma is generated from a fluorine containing gas; and, subsequently, depositing a dielectric layer directly on the at least one surface of the silicon substrate by vapor deposition, wherein the vapor deposition is carried out in the processing region; and taking the silicon substrate out of the processing chamber.

According to various embodiments, the processing chamber may be or may include a plasma processing chamber, e.g. a PEVCD processing chamber (also referred to as PECVD reactor).

According to various embodiments, the fluorine containing gas may be provided to the remote plasma source with a gas flow rate of less than 100 sccm. According to various embodiments, the fluorine containing gas may be provided to the remote plasma source with a gas flow rate of about 5 sccm. According to various embodiments, the fluorine containing gas may be provided to the remote plasma source with a gas flow rate in the range from about 1 sccm to about 100 sccm. According to various embodiments, the fluorine containing gas may be provided to the remote plasma source with a gas flow rate in the range from about 1 sccm to about 50 sccm.

According to various embodiments, pretreating the at least one surface of the silicon substrate may include completely removing native oxide from the at least one surface of the silicon substrate.

According to various embodiments, pretreating the at least one surface of the silicon substrate and/or depositing the dielectric layer may be carried out under vacuum conditions so that the at least one surface of the silicon substrate remains free of native oxide after pretreating and before depositing the dielectric layer. According to various embodiments, vacuum conditions may include a total pressure of less than about 100 mbar.

According to various embodiments, pretreating the at least one surface of the silicon substrate and/or depositing the dielectric layer may be carried out in an inert gas atmosphere a so that the at least one surface of the silicon substrate remains free of native oxide after pretreating and before depositing the dielectric layer. The inert gas atmosphere may be provided after evacuating the processing region to remove air, in particular to remove oxygen.

According to various embodiments, during pretreating the at least one surface of the silicon substrate and/or depositing the dielectric layer the gas pressure in the processing chamber may be less than about 300 Torr, e.g. in the range from about 1 mTorr to about 300 Torr, e.g. in the range from about 1 mTorr to about 200 Torr.

According to various embodiments, the halogen (e.g. fluorine) containing gas may be diluted with an inert gas to a gas mixture containing less than about 1 molar percentage of the halogen (e.g. fluorine) containing gas. According to various embodiments, the halogen (e.g. fluorine) containing gas may be diluted with an inert gas to a gas mixture containing more than about 99 molar percentage of the inert gas. According to various embodiments, the inert gas may include or may consist of nitrogen, argon, helium, or any other noble gas.

According to various embodiments, the halogen (e.g. fluorine) containing gas may be diluted in the range from about 1/1000 (which may refer to about 99.9 molar percentage of the inert gas) to about 1/100 (which may refer to about 99.0 molar percentage of the inert gas), e.g. in the range from about 1/700 (which may refer to about 99.85 molar percentage of the inert gas) to about 1/200 (which may refer to about 99.5 molar percentage of the inert gas).

According to various embodiments, depositing the dielectric layer may include depositing amorphous carbon. According to various embodiments, depositing the dielectric layer may include depositing amorphous carbon by PECVD.

According to various embodiments, depositing the dielectric layer may include depositing silicon oxide. According to various embodiments, depositing the dielectric layer may include depositing silicon oxide by PECVD.

According to various embodiments, depositing the dielectric layer may include introducing a hydrogen containing gas into the processing region before and/or during depositing the dielectric layer.

According to various embodiments, depositing the dielectric layer may include depositing diamond-like carbon. According to various embodiments, depositing the dielectric layer may include depositing diamond-like carbon. According to various embodiments, depositing the dielectric layer may include depositing diamond-like carbon by PECVD.

According to various embodiments, depositing the dielectric layer may include depositing hydrogenated amorphous carbon. According to various embodiments, depositing the dielectric layer may include depositing hydrogenated amorphous carbon by PECVD.

According to various embodiments, depositing the dielectric layer may include depositing silicon doped hydrogenated amorphous carbon. According to various embodiments, depositing the dielectric layer may include depositing silicon doped hydrogenated amorphous carbon by PECVD.

According to various embodiments, depositing the dielectric layer may include depositing an amorphous layer including silicon and carbon. According to various embodiments, depositing the dielectric layer may include depositing an amorphous layer including silicon and carbon by PECVD.

According to various embodiments, a method for processing a silicon layer may include: exposing at least one surface of the silicon layer to an etch plasma that is provided by a remote plasma source, wherein the etch plasma is generated in the remote plasma source from a fluorine containing gas; and, subsequently, depositing a dielectric layer directly on the at least one surface of the silicon layer.

According to various embodiments, a method for processing a silicon layer may include: generating an etch plasma in a plasma chamber of a remote plasma source, wherein the plasma chamber of the remote plasma source is coupled to a processing chamber for processing the semiconductor layer; introducing the etch plasma into the processing chamber to remove a native oxide layer from a surface of the silicon layer and at most negligible removing silicon of the silicon layer; and, subsequently, depositing a dielectric layer directly on the at least one surface of the silicon layer.

According to various embodiments, at most negligible removing silicon of the silicon layer may include the case where no silicon of the silicon layer is removed. According to various embodiments, at most negligible removing silicon of the silicon layer may include removing at most a few atomic layers of the single crystalline silicon layer, e.g. up to about 100 atomic layers (e.g. 1 to 100 atomic layers), e.g. up to about 50 atomic layers (e.g. 1 to 50 atomic layers), e.g. up to about 10 atomic layers (e.g. 1 to 10 atomic layers), e.g. up to 5 atomic layers (e.g. 1 to 5 atomic layers). Further, at most negligible removing silicon of the silicon layer may include removing up to about 30 nm, e.g. about 1 nm to about 30 nm, of the silicon of the silicon layer in thickness direction (e.g. a direction perpendicular to a main processing surface of a wafer).

According to various embodiments, an electronic device may include: a silicon layer, wherein at least one surface of the silicon layer is free of native oxide; a dielectric layer disposed directly one the at least one surface of the silicon layer, wherein the dielectric layer may include hydrogen and wherein an interface is provided between the silicon layer and the dielectric layer having an interface state density of less than about $2 \cdot 10^{13}$ $cm^{-2}$ $eV^{-1}$.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method for processing a semiconductor substrate, the semiconductor substrate comprising a semiconductor layer and a native oxide layer disposed on at least one surface of the semiconductor layer, wherein the semiconductor layer is a silicon or a silicon carbide layer, the method comprising:
generating an etch plasma in a plasma chamber of a remote plasma source, wherein the plasma chamber of the remote plasma source is coupled to a processing chamber for processing the semiconductor layer;
- removing the native oxide layer from the semiconductor substrate comprising etching the native oxide layer and etching from between 1 and 100 atomic layers of the semiconductor layer below the native oxide layer by introducing the etch plasma into the processing chamber; and, subsequently,
- depositing a dielectric layer directly on the surface of the semiconductor layer, wherein the dielectric layer is deposited by chemical vapor deposition using a hydrocarbon containing precursor, and wherein an interface between the semiconductor layer and the dielectric layer has an interface state density of less than about $2\times 10^{13}$ cm$^{-2}$ eV$^{-1}$;
- wherein the etch plasma is generated in the plasma chamber of the remote plasma source from a halogen containing gas.

2. The method according to claim 1,
wherein the dielectric layer is deposited by plasma-enhanced chemical vapor deposition.

3. The method according to claim 1,
wherein the dielectric layer comprises at least one of a carbon based dielectric material or a silicon based dielectric material.

4. The method according to claim 1, wherein the semiconductor layer comprises silicon and the halogen containing gas comprises fluorine.

5. A method for processing a silicon substrate, the silicon substrate having a native oxide layer disposed on at least one surface of the silicon substrate, the method comprising:
- bringing the silicon substrate into a processing region of a processing chamber;
- providing a vacuum in the processing region;
- pretreating the at least one surface of the silicon substrate using an etch plasma that is provided in the processing region by a remote plasma source coupled to the processing chamber, wherein the etch plasma is generated from a fluorine containing gas; and, subsequently, wherein pretreating the silicon substrate further comprises etching so as to remove the native oxide layer and to remove an amount of the silicon layer the at least one surface less than or equal to 100 nm;
- forming a gate dielectric layer, wherein forming the gate dielectric layer comprises depositing a dielectric layer directly on the at least one surface of the silicon substrate by vapor deposition, wherein the vapor deposition is carried out in the processing region, wherein depositing the dielectric layer comprises introducing a hydrogen containing gas into the processing region during depositing the dielectric layer; and
- taking the silicon substrate out of the processing chamber, wherein the deposited dielectric layer comprises hydrogenated amorphous carbon.

6. The method according to claim 5,
wherein pretreating the at least one surface of the silicon substrate comprises completely removing native oxide from the at least one surface of the silicon substrate.

7. The method according to claim 5,
wherein pretreating the at least one surface of the silicon substrate and depositing the dielectric layer are carried out under vacuum conditions so that the at least one surface of the silicon substrate remains free of native oxide after pretreating and before depositing the dielectric layer.

8. The method according to claim 5,
wherein the fluorine containing gas is diluted with an inert gas to a gas mixture containing more than 99 molar percentage of the inert gas.

9. The method according to claim 5,
wherein depositing the dielectric layer comprises depositing amorphous carbon.

10. The method according to claim 5,
wherein depositing the dielectric layer comprises depositing silicon oxide.

11. The method according to claim 5,
wherein depositing the dielectric layer comprises depositing diamond-like carbon.

12. The method according to claim 5,
wherein depositing the dielectric layer comprises depositing silicon doped hydrogenated amorphous carbon.

* * * * *